(12) United States Patent
Wu et al.

(10) Patent No.: US 11,749,607 B2
(45) Date of Patent: Sep. 5, 2023

(54) PACKAGE AND METHOD OF MANUFACTURING THE SAME

(71) Applicant: Taiwan Semiconductor Manufacturing Company, Ltd., Hsinchu (TW)

(72) Inventors: Chih-Wei Wu, Yilan County (TW); Chen-Hua Yu, Hsinchu (TW); Kuo-Chung Yee, Taoyuan (TW); Szu-Wei Lu, Hsinchu (TW); Ying-Ching Shih, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/705,373

(22) Filed: Mar. 27, 2022

(65) Prior Publication Data
US 2022/0216152 A1    Jul. 7, 2022

Related U.S. Application Data

(62) Division of application No. 16/655,260, filed on Oct. 17, 2019, now Pat. No. 11,289,424.
(Continued)

(51) Int. Cl.
*H01L 23/495* (2006.01)
*H01L 23/538* (2006.01)
(Continued)

(52) U.S. Cl.
CPC ........ *H01L 23/5381* (2013.01); *H01L 21/486* (2013.01); *H01L 21/4857* (2013.01);
(Continued)

(58) Field of Classification Search
CPC ............. H01L 23/5381; H01L 23/3121; H01L 23/5384; H01L 21/4857; H01L 21/486;
(Continued)

(56) References Cited

U.S. PATENT DOCUMENTS

| | | | | |
|---|---|---|---|---|
| 8,288,854 B2 * | 10/2012 | Weng | ....................... | H01L 23/13 |
| | | | | 361/679.01 |
| 8,456,018 B2 * | 6/2013 | Park | ........................ | H01L 24/92 |
| | | | | 257/774 |
| 8,742,576 B2 * | 6/2014 | Thacker | .................. | H01L 25/50 |
| | | | | 174/250 |
| 8,993,380 B2 | 3/2015 | Hou et al. | | |
| 9,281,254 B2 | 3/2016 | Yu et al. | | |

(Continued)

*Primary Examiner* — Nitin Parekh
(74) *Attorney, Agent, or Firm* — JCIPRNET

(57) ABSTRACT

Provided are a package and a method of manufacturing the same. The package includes a first die, a second die, a bridge structure, an encapsulant, and a redistribution layer (RDL) structure. The first die and the second die are disposed side by side. The bridge structure is disposed over the first die and the second die to electrically connect the first die and the second die. The encapsulant laterally encapsulates the first die, the second die, and the bridge structure. The RDL structure is disposed over a backside of the bridge structure and the encapsulant. The RDL structure includes an insulating structure and a conductive pattern, the conductive pattern is disposed over the insulating structure and extending through the insulating structure and a substrate of the bridge structure, so as to form at least one through via in the substrate of the bridge structure.

20 Claims, 29 Drawing Sheets

Related U.S. Application Data

(60) Provisional application No. 62/773,105, filed on Nov. 29, 2018.

(51) Int. Cl.
  *H01L 23/31* (2006.01)
  *H01L 23/00* (2006.01)
  *H01L 25/00* (2006.01)
  *H01L 21/56* (2006.01)
  *H01L 21/48* (2006.01)
  *H01L 25/065* (2023.01)

(52) U.S. Cl.
  CPC ........ *H01L 21/563* (2013.01); *H01L 23/3121* (2013.01); *H01L 23/5383* (2013.01); *H01L 23/5384* (2013.01); *H01L 24/16* (2013.01); *H01L 25/0652* (2013.01); *H01L 25/0655* (2013.01); *H01L 25/50* (2013.01); *H01L 2224/16235* (2013.01)

(58) Field of Classification Search
  CPC ............... H01L 21/563; H01L 25/0652; H01L 25/0655
  USPC .................................................. 257/774, 723
  See application file for complete search history.

(56) References Cited

U.S. PATENT DOCUMENTS

| | | |
|---|---|---|
| 9,299,649 B2 | 3/2016 | Chiu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 9,443,824 B1* | 9/2016 | We ...................... H01L 25/0655 |
| 9,461,018 B1 | 10/2016 | Tsai et al. |
| 9,496,189 B2 | 11/2016 | Yu et al. |
| 9,666,502 B2 | 5/2017 | Chen et al. |
| 9,735,131 B2 | 8/2017 | Su et al. |
| 2009/0243094 A1* | 10/2009 | Itoh ...................... H01L 23/3135 257/E23.116 |
| 2011/0304349 A1* | 12/2011 | Stillman ............. H01L 25/0657 324/762.04 |
| 2015/0048515 A1* | 2/2015 | Zhang ................. H01L 25/0655 257/774 |
| 2016/0085899 A1* | 3/2016 | Qian ................... H01L 23/5383 257/774 |
| 2016/0086930 A1* | 3/2016 | Koey .................. H01L 25/0652 257/773 |
| 2017/0301625 A1* | 10/2017 | Mahajan ............. H01L 23/5389 |
| 2018/0190581 A1* | 7/2018 | Lin ...................... H01L 23/5389 |
| 2019/0109117 A1* | 4/2019 | Fang ...................... H01L 24/19 |
| 2019/0295952 A1* | 9/2019 | Sikka ................... H01L 23/5381 |
| 2019/0304914 A1* | 10/2019 | Koh .................... H01L 23/5384 |
| 2020/0098692 A1* | 3/2020 | Lift ..................... H01L 23/5386 |

* cited by examiner

PACKAGE AND METHOD OF MANUFACTURING THE SAME

CROSS-REFERENCE TO RELATED APPLICATION

This is a divisional application of and claims the priority benefit of U.S. application Ser. No. 16/655,260, filed on Oct. 17, 2019, now allowed, which claims the priority benefit of U.S. provisional application Ser. No. 62/773,105, filed on Nov. 29, 2018. The entirety of each of the above-mentioned patent applications is hereby incorporated by reference herein and made a part of this specification.

BACKGROUND

The semiconductor industry has experienced rapid growth due to continuous improvements in the integration density of various electronic components (i.e., transistors, diodes, resistors, capacitors, etc.). For the most part, this improvement in integration density has come from continuous reductions in minimum feature size, which allows more of the smaller components to be integrated into a given area. These smaller electronic components also demand smaller packages that utilize less area than previous packages. Some smaller types of packages for semiconductor components include quad flat packages (QFPs), pin grid array (PGA) packages, ball grid array (BGA) packages, flip chips (FC), three-dimensional integrated circuits (3DICs), wafer level packages (WLPs), and package on package (PoP) devices and so on.

Currently, integrated fan-out packages are becoming increasingly popular for their compactness.

DETAILED DESCRIPTION

Figure 1A:
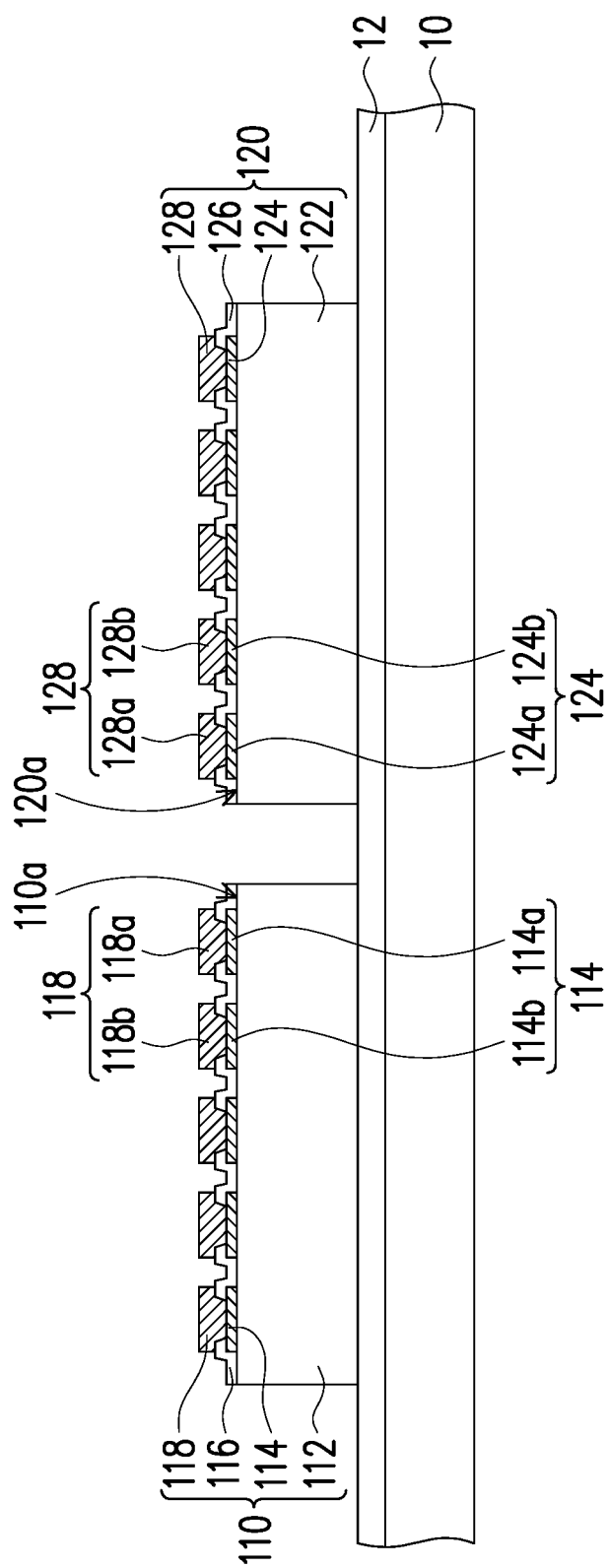
FIG. 1A to FIG. 1J are schematic cross-sectional views illustrating a method of manufacturing a package according to a first embodiment of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "above", "upper" and the like, may be used herein for ease of description to describe one element or feature's relationship to another element(s) or feature(s) as illustrated in the FIG.s. The spatially relative terms are intended to encompass different orientations of the device in use or operation in addition to the orientation depicted in the FIG.s. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A to FIG. 1J are schematic cross-sectional views illustrating a method of manufacturing a package according to a first embodiment of the disclosure.

Referring to FIG. 1A, a carrier 10 is provided. The carrier 10 may be a glass carrier, a ceramic carrier, or the like. A first die 110 and a second die 120 are attached side by side to the carrier 10 through an adhesive layer 12, such as a die attach film (DAF), silver paste, or the like. In some embodiments, the first die 110 and the second die 120 are form by performing a singulation step to separate the individual dies, for example, by cutting through the semiconductor wafer. In some alternative embodiments, a de-bonding layer may be formed between the carrier 10 and the adhesive layer 12. The de-bonding layer may be formed of an adhesive such as an Ultra-Violet (UV) glue, a Light-to-Heat Conversion (LTHC) glue, or the like, or other types of adhesives. The de-bonding layer is decomposable under the heat of light to thereby release the carrier 10 from the overlying structures that will be formed in subsequent steps.

In some embodiments, the first die 110 and the second die 120 may be a same type of dies or different types of dies. In another embodiment, the first die 110 or the second die 120 may include active components (e.g., transistors or the like) and, optionally, passive components (e.g., resistors, capacitors, inductors, or the like). The first die 110 or the second die 120 may be or include a logic die, such as a central processing unit (CPU) die, a graphic processing unit (GPU) die, a micro control unit (MCU) die, an input-output (I/O) die, a baseband (BB) die, or an application processor (AP) die. In some alternative embodiments, the first die 110 or the second die 120 may include a memory die such as high bandwidth memory (HBM) die.

In detail, the first die 110 includes a semiconductor substrate 112, a plurality of conductive pads 114, a passivation layer 116, and a plurality of connectors 118. In some embodiments, the semiconductor substrate 112 may be made of silicon or other semiconductor materials. Alternatively, or additionally, the semiconductor substrate 112 may include other elementary semiconductor materials such as germanium. In some embodiments, the semiconductor substrate 112 is made of a compound semiconductor such as silicon carbide, gallium arsenic, indium arsenide or indium phosphide. In some embodiments, the semiconductor substrate 112 is made of an alloy semiconductor such as silicon germanium, silicon germanium carbide, gallium arsenic phosphide, or gallium indium phosphide. Furthermore, the semiconductor substrate 112 may be a semiconductor on insulator such as silicon on insulator (SOI) or silicon on sapphire.

The conductive pads 114 are disposed on a front side 110a of the first die 110. Herein, the front side 110a of the first die 110 is referred to as a top surface of the semiconductor substrate 112. In some embodiments, the conductive pads 114 may be a part of an interconnection structure (not shown) and electrically connected to the integrated circuit devices (not shown) formed on the semiconductor substrate 112. In some embodiments, the conductive pads 114 may be made of conductive materials with low resistivity, such as copper (Cu), aluminum (Al), Cu alloys, Al alloys, or other suitable materials. In some embodiments, the conductive pads 114 includes the first conductive pad 114a adjacent to the second die 120 and the second conductive pads 114b away from the second die 120.

The passivation layer 116 is formed on the front side 110a of the semiconductor substrate 112 and covers a portion of the conductive pads 114 in some embodiments. A portion of the conductive pads 114 is exposed by the passivation layer 116 and serves as an external connection of the first die 110. In some embodiments, the passivation layer 116 may be a single layer or a multi-layered structure, including a silicon oxide layer, a silicon nitride layer, a silicon oxy-nitride layer, a dielectric layer formed by other suitable dielectric materials or a combination thereof. In some alternative embodiments, the passivation layer 116 may include polyimide, epoxy resin, acrylic resin, phenol resin, benzocyclobutene (BCB), polybenzoxazole (PBO), or any other suitable polymer-based dielectric material.

In FIG. 1A, a plurality of connectors 118 are formed on the portion of the conductive pads 114 exposed by the passivation layer 116. In detail, the connectors 118 includes first connectors 118a on and in contact with the first conductive pads 114a and second connectors 118b on and in contact with the second conductive pads 114b. In some embodiments, the material of the first connectors 118a and the second connectors 118b includes copper, copper alloys, or other conductive materials, and may be formed by deposition, plating, or other suitable techniques. In some embodiments, the formation of the connectors 118 includes conformally sputtering, for example, a seed layer on the semiconductor substrate 112, forming one or more patterned masks having a plurality of openings corresponding to the conductive pads 114, filling in the openings with a conductive material, removing the patterned masks, and removing a portion of the seed layer uncovered by the conductive material, so as to form the connectors 118.

Similarly, the second die 120 includes a semiconductor substrate 122, a plurality of conductive pads 124 disposed on a front side 120a of the second die 120, a passivation layer 126 covering a portion of the conductive pads 124, and a plurality of connectors 128 disposed on the conductive pads 124. Herein, the front side 120a of the second die 120 is referred to as a top surface of the semiconductor substrate 122. The conductive pads 124 includes the first conductive pad 124a adjacent to the first die 110 and the second conductive pads 124b away from the first die 110. The connectors 128 includes a first connector 128a on the first conductive pad 124a and a second connectors 128b on the second conductive pads 124b. The material and forming method of the semiconductor substrate 122, the conductive pads 124, the passivation layer 126, and the connectors 128 are similar to the material and forming method of the semiconductor substrate 112, the conductive pads 114, the passivation layer 116, and the connectors 118 illustrated in above embodiments. Thus, details thereof are omitted here.

In some embodiments, a thickness of the semiconductor substrate 112 and a thickness of the semiconductor substrate 122 may be the same or different. In some alternative embodiments, a height of the connector 118 and a height of the connector 128 may be the same or different. In other embodiments, a distance between a top surface of the connector 118 and a bottom surface of the semiconductor substrate 112 and a distance between a top surface of the connector 128 and a bottom surface of the semiconductor substrate 122 are substantially the same.

Figure 1B:
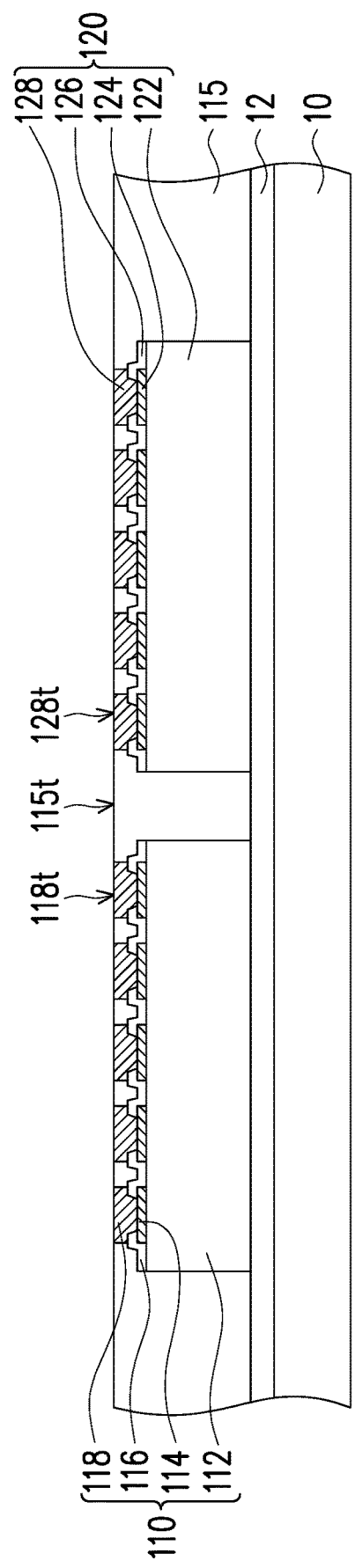

Referring to FIG. 1B, an encapsulant 115 is formed to laterally encapsulate the first die 110 and the second die 120. Specifically, the encapsulant 115 is formed by an overmolding process that includes following steps. An encapsulation material is formed to fill in gaps between the semiconductor substrates 112 and 122, between the connectors 118, between the connectors 128, and between the connectors 118 and 128. That is, the first die 110 and the second die 120 are fully covered and not revealed by the encapsulation material. A planarization process is performed to remove a portion of the encapsulation material until the connectors 118 and 128 are exposed. In some embodiments, the planarization process may include a mechanical grinding process and/or a chemical mechanical polishing (CMP) process. In the case, top surfaces 118t of the connectors 118, top surfaces 128t of the connectors 128 and a top surface 115t of the encapsulant 115 are substantially coplanar. In some embodiments, the encapsulation material may include a molding compound, a molding underfill, a resin (such as an epoxy resin), or the like. In some alternative embodiments, during performing the planarization process to form the encapsulant 115, upper portions of the connectors 118 and 128 are also removed.

Figure 1C:
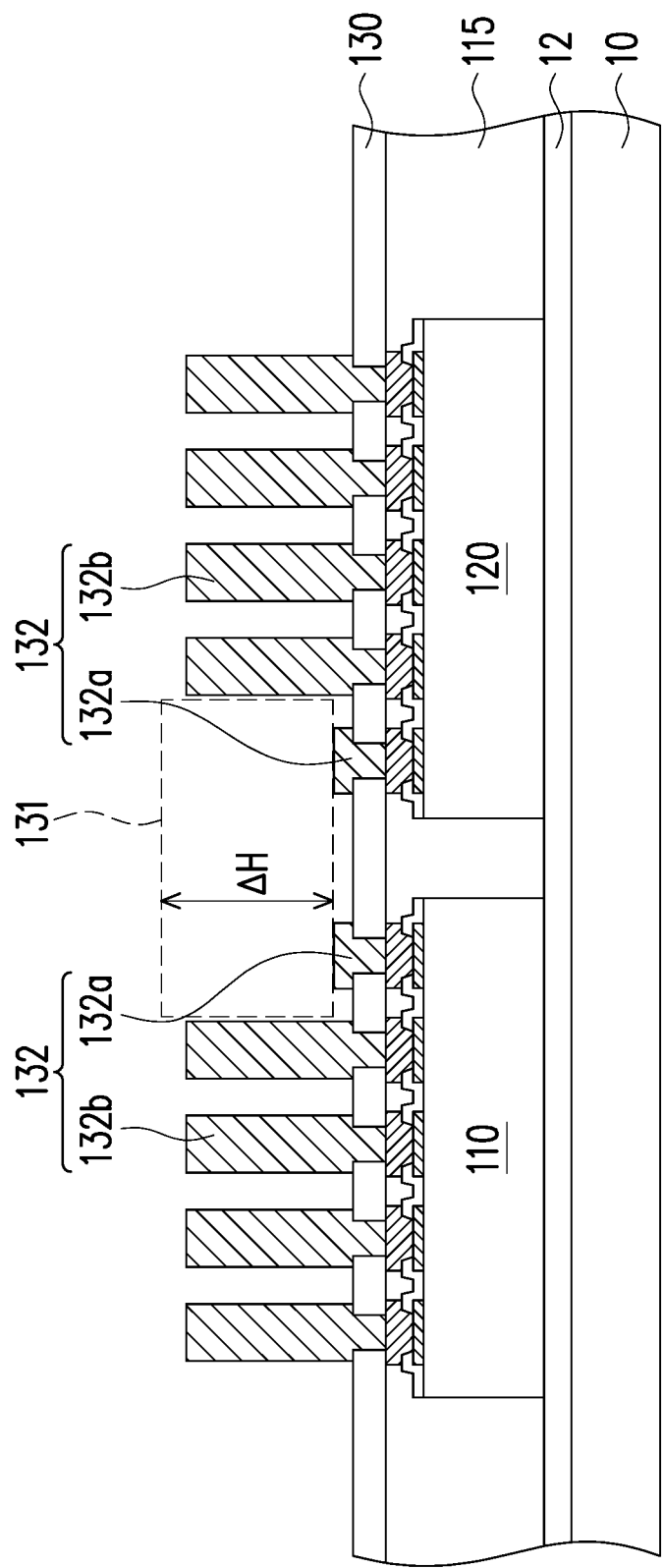

Referring to FIG. 1C, after forming the encapsulant 115, a protective layer 130 is formed over the encapsulant 115, the first die 110, and the second die 120. The protective layer 130 is patterned and has a plurality of openings to expose at least a portion of the connectors 118 and 128. In some embodiments, a material of the protective layer 130 includes polyimide, epoxy resin, acrylic resin, phenol resin, benzocyclobutene (BCB), polybenzoxazole (PBO), or any other suitable polymer-based dielectric material. In some alternative embodiments, the protective layer 130 may be a single layer or a multi-layered structure, including a silicon oxide layer, a silicon nitride layer, a silicon oxy-nitride layer, a dielectric layer formed by other suitable dielectric materials or a combination thereof. The protective layer 130 may be formed by performing a suitable forming method, such as spin-on coating, chemical vapor deposition (CVD), plasma-enhanced chemical vapor deposition (PECVD), or the like, and then performing a suitable patterning method, such as lithography and etching steps.

After forming the protective layer 130, a plurality of conductive vias 132 are respectively formed over the connectors 118 and 128. In detail, as shown in FIG. 1C, the conductive vias 132 include first conductive vias 132a and second conductive vias 132b. The first conductive vias 132a are respectively disposed on and in contact with the first connectors 118a and 128a. The second conductive vias 132b are respectively disposed on and in contact with the second connectors 118b and 128b. In some embodiment, the first conductive vias 132a and the second conductive vias 132b have a same horizontal size or width. However, the disclosure is not limited thereto, in other embodiments, the first conductive vias 132a and the second conductive vias 132b may have different horizontal size or width. For example, the width of the first conductive via 132a may be greater than or less than the width of the second conductive vias 132b.

In some embodiments, the material of the first conductive vias 132a and the second conductive vias 132b includes copper, copper alloys, or other conductive materials, and may be formed by deposition, plating, or other suitable techniques. In some embodiments, the formation of the first and second conductive vias 132a, 132b includes conformally sputtering, for example, a seed layer (not shown) on the protective layer 130, forming one or more patterned masks (not shown) having a plurality of openings corresponding to the connectors 118 and 128, filling in the openings with a conductive material (not shown), removing the patterned masks, and removing a portion of the seed layer uncovered by the conductive material, so as to form the first conductive vias 132a and the second conductive vias 132b. In some embodiments, the first conductive vias 132a and the second conductive vias 132b are formed with different heights. In some embodiments, a height of the first conductive vias 132a is less than a height of the second conductive vias 132b. In some alternative embodiments, the first conductive vias 132a and the second conductive vias 132b may be formed with the same height, and the second conductive vias 132b may be further elongated by selective deposition, thereby resulting in a height difference between the second conductive vias 132b and the first conductive vias 132a. In some other alternative embodiments, rather than elongating the second conductive vias 132b, the first conductive vias 132a are shortened, for example, by performing an etching step in the presence of an auxiliary mask (not shown) that shields the second conductive vias 132b. Choice of a method to generate the height difference between the first conductive vias 132a and the second conductive vias 132b may be dictated by consideration such as overall cost of the process and design need. In any case, the method chosen to produce a difference in height between the first conductive vias 132a and the second conductive vias 132b, or even the existence of a difference in height, are not to be construed as a limitation of the present disclosure.

Figure 1D:
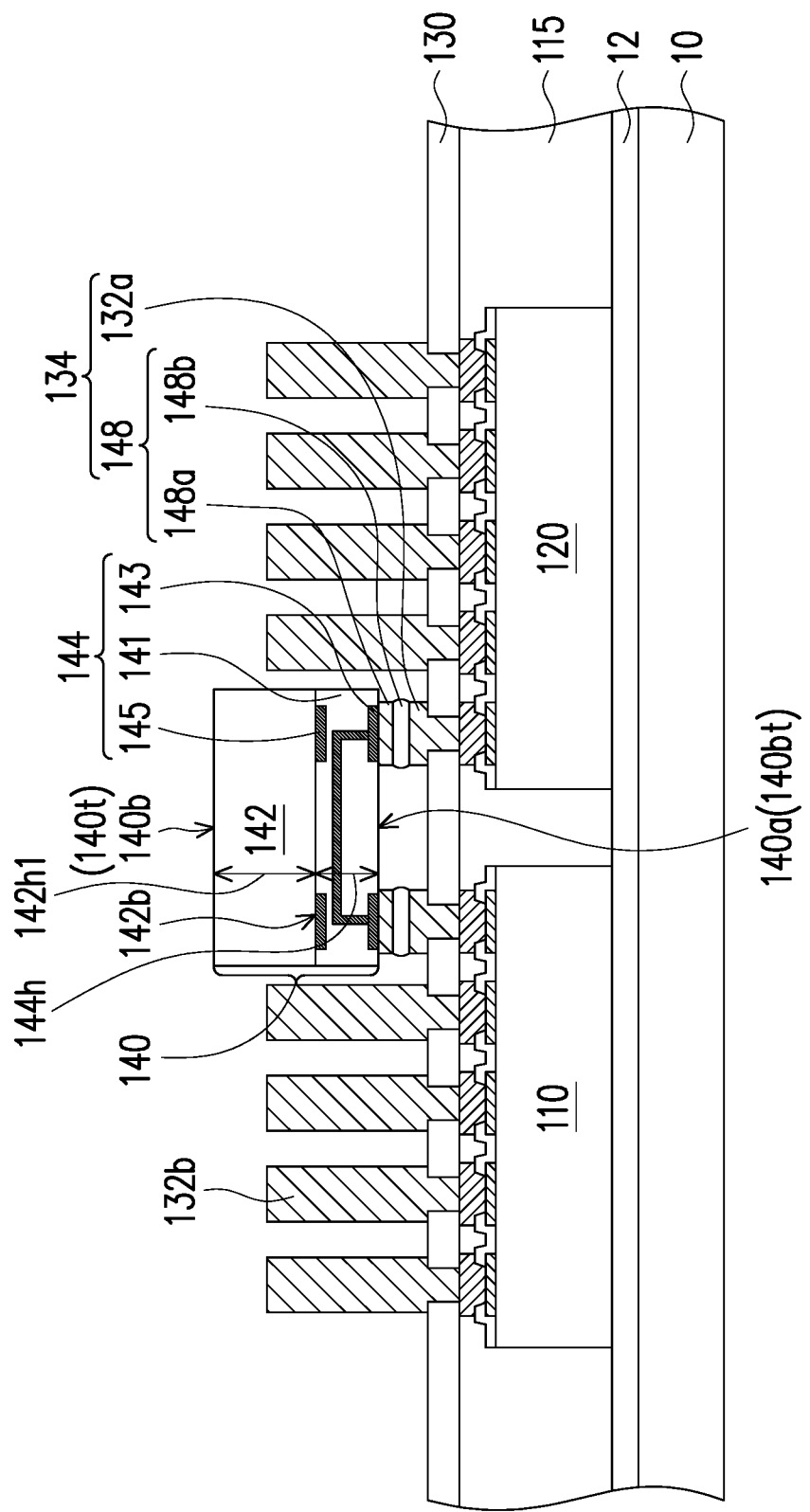

After forming the conductive vias 132, as shown in FIG. 1C, an accommodation space 131 is surrounded or built-up by the first conductive vias 132a and the second conductive vias 132b. In some embodiments, the accommodation space 131 is used to mount a bridge structure 140 (as shown in FIG. 1D). In some alternative embodiments, a size of the accommodation space 131 may be adjusted by changing the number and/or the arrangement of the first conductive vias 132a and the second conductive vias 132b. For example, when the first conductive vias 132a includes more than two conductive vias, the size of the accommodation space 131 will become greater to accommodate greater bridge structure 140 (shown in FIG. 1D) or more than one bridge structure 140. On the other hand, the size of the accommodation space 131 may be adjusted by changing a difference (ΔH) in height between the first conductive vias 132a and the second conductive vias 132b. That is, the size of the accommodation space 131 will become greater when the difference (ΔH) in height between the first conductive vias 132a and the second conductive vias 132b is getting greater.

Referring to FIG. 1C and FIG. 1D, the bridge structure 140 is bonded to the first die 110 and the second die 120 in a flip-chip bonding. That is, the bridge structure 140 is upside down, so that a front side 140a of the bridge structure 140 faces toward the carrier 10. In the case, a backside 140b of the bridge structure 140 is referred to as a top surface 140t of the bridge structure 140, while the front side 140a of the bridge structure 140 is referred to as a bottom surface 140bt of the bridge structure 140.

In some embodiments, the bridge structure 140 may be a bridge, such as a silicon bridge, providing an interconnecting structure for the first die 110 and the second dies 120. As shown in the cross-section view of FIG. 1D, the bridge structure 140 traverses or is across the first die 110 and the second die 120 to provide a shorter electrical connection path between the first die 110 and the second dies 120. In other words, in some embodiments in which the bridge structure 140 is the bridge, the bridge structure 140 includes interconnecting structure, and frees from active components (e.g., transistors or the like) and/or passive components (e.g., resistors, capacitors, inductors, or the like). In the embodiment, the bridge structure 140 may have fine pitch conductive lines. Therefore, the routing density of a to-be-formed RDL structure 160 (as shown in FIG. 1J) may be reduced, thereby decreasing the cost of forming the whole package structure. Further, the bridge structure 140 and the to-be-formed RDL structure 160 have different routing densities, the package configuration may be more flexible.

In some alternative embodiments, the bridge structure 140 may include an interconnecting structure and active components (e.g., transistors or the like) and, optionally, passive components (e.g., resistors, capacitors, inductors, or the like). The bridge structure 140, the first die 110, and the second die 120 may be the same type of dies or the different types of dies. In some embodiments, the size or width of the bridge structure 140 is substantially less than, equal to, or greater than the size or width of the first die 110 and/or second die 120.

In detail, as shown in FIG. 1D, the bridge structure 140 includes a substrate 142, an interconnecting structure 144, and a plurality of connectors 148. In some embodiments, the substrate 142 may be made of silicon or other semiconductor materials. For example, the substrate 142 may be a silicon bulk substrate. In some alternative embodiments, a thickness 142h1 of the substrate 142 is 5 μm to 200 μm. Within this range, the bridge structure 140 may have better reliability performance. If the thickness 142h1 of the substrate 142 is too small, more molding compound would be required, which may cause warpage of the wafer. If the thickness 142h1 of the substrate 142 is too large, high aspect ratio capability for etching process would be required. The interconnecting structure 144 is disposed on a bottom surface 142b of the substrate 142. The interconnecting structure 144 includes a dielectric layer 141 and a conductive pattern 143 embedded in the dielectric layer 141. In some embodiments, the dielectric layer 141 may include a dielectric material, such as silicon oxide, silicon nitride, silicon oxy-nitride, or the like, or a combination thereof. The conductive pattern 143 may include a conductive material, such as copper, copper alloys, or other conductive materials. In addition, the interconnecting structure 144 further includes a plurality of contacts 145 that are in contact with the bottom surface 142b of the substrate 142. In some embodiments, the contacts 145 and the conductive pattern 143 may have a same conductive material, and the contacts 145 may be electrically connected to the conductive pattern 143. Alternatively, the contacts 145 and the conductive pattern 143 may have different conductive materials. In some alternative embodiments, a thickness 144h of the interconnecting structure 144 is 1 µm to 20 µm. The thickness 144h of the interconnecting structure 144 may be thicker or thinner depending on the requirements of the process and the material of the conductive pattern 143.

As shown in FIG. 1D, the connectors 148 are formed on the conductive pattern 143 exposed by the dielectric layer 141. In some embodiments, the connectors 148 may have copper posts 148a and solder caps 148b, but the disclosure is not limited thereto, and other conductive structures such as solder bumps, gold bumps or metallic bumps may also be used as the connectors 148. In some alternative embodiments, the connectors 148 may be copper posts 148a without solder caps 148b. In FIG. 1D, the bridge structure 140 is bonded to the first die 110 and the second die 120 by the connectors 148. In some embodiments, the connectors 148 of the bridge structure 140 may be bonded to the conductive vias 132a through a reflow process.

In FIG. 1D, the connectors 148 are bonded to the first conductive vias 132a to form bonding structures 134. In some embodiments, the bonding structure 134 may be a micro-bump structure that includes a solder disposed between two metal posts. Herein, the micro-bump structure may be referred to as a connector with a dimension of 5 µm to 50 µm.

Figure 1E:
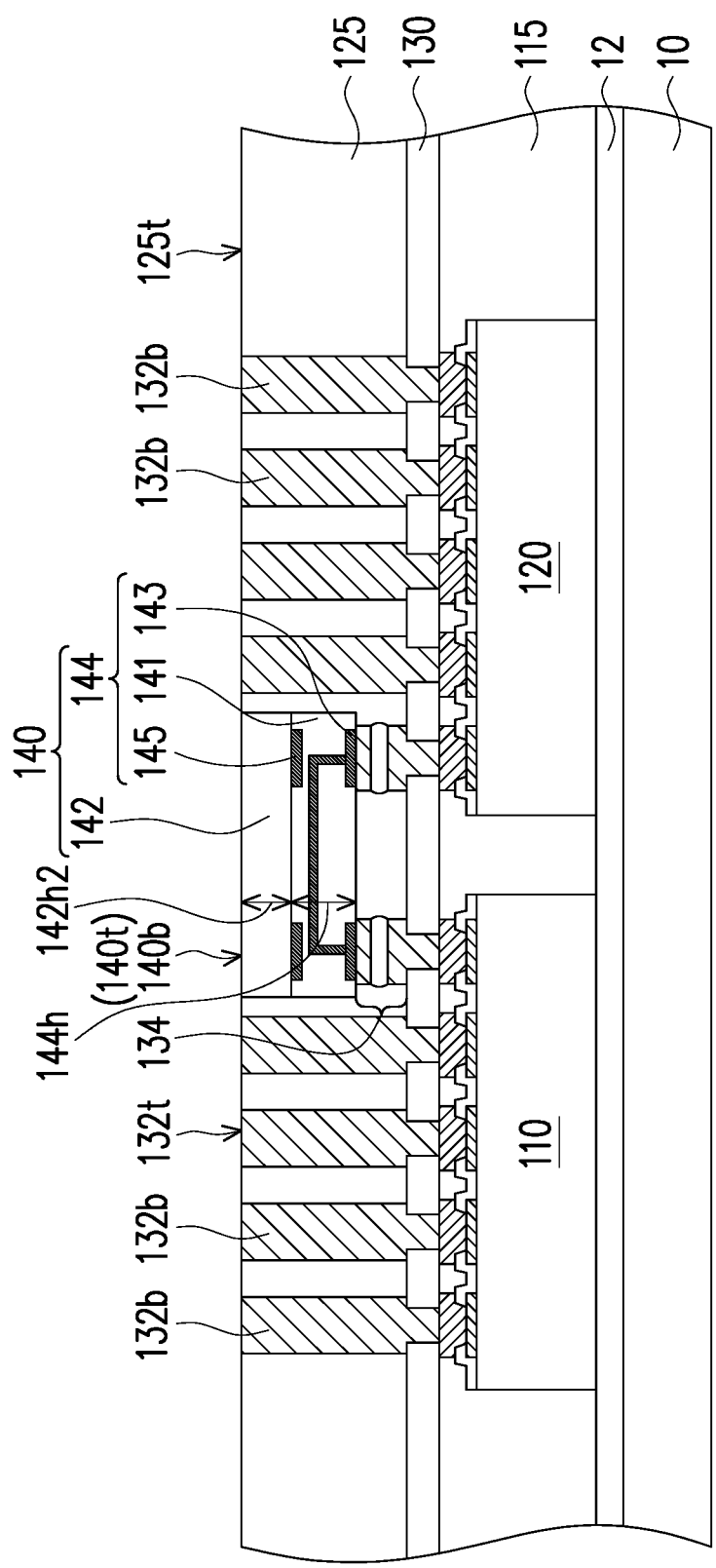

Referring to FIG. 1D and FIG. 1E, an encapsulant 125 is formed to laterally encapsulate the bridge structure 140 and the second conductive vias 132b. Specifically, the formation of the encapsulant 125 may be an over-molding process that includes following steps. First, an encapsulation material is formed over the protective layer 130 to fill in gaps between the bonding structures 134, between the second conductive vias 132b and the bridge structure 140, and between the second conductive vias 132b. That is, the second conductive vias 132b and the bridge structure 140 are fully covered and not revealed by the encapsulation material. In some embodiments, the encapsulation material includes a molding compound, a molding underfill, a resin (such as an epoxy resin), or the like.

As shown in FIG. 1E, the encapsulation material is then partially removed by a planarization process until the top surface 132t of the second conductive vias 132b are exposed. In some embodiments, upper portions of the second conductive vias 132b and/or an upper portion of the bridge structure 140 may also be removed during the planarization process. That is, the substrate 142 of the bridge structure 140 is thinned during the planarization process. In some alternative embodiments, a thickness 142h2 of the substrate 142 is 1 µm to 20 µm and a ratio of the thickness 142h2 of the substrate 142 to the thickness 144h of the interconnecting structure 144 is 0.1 to 200. Within this range, the bridge structure 140 may have better reliability performance. If the thickness 142h2 of the substrate 142 is too small, more molding compound would be required, which may cause warpage of the wafer. If the thickness 142h2 of the substrate 142 is too large, high aspect ratio capability for etching process would be required.

In some other embodiments, the planarization process includes a mechanical grinding process and/or a chemical mechanical polishing (CMP) process. After performing the planarization process, the top surface 132t of the second conductive vias 132b, the top surface 140t (or the backside 140b) of the bridge structure 140, and a top surface 125t of the encapsulant 125 are substantially coplanar. Further, the second conductive vias 132b is encapsulated by the encapsulant 125, thus, the second conductive vias 132b may be referred to as through insulating vias (TIVs) 132b.

Figure 1F:
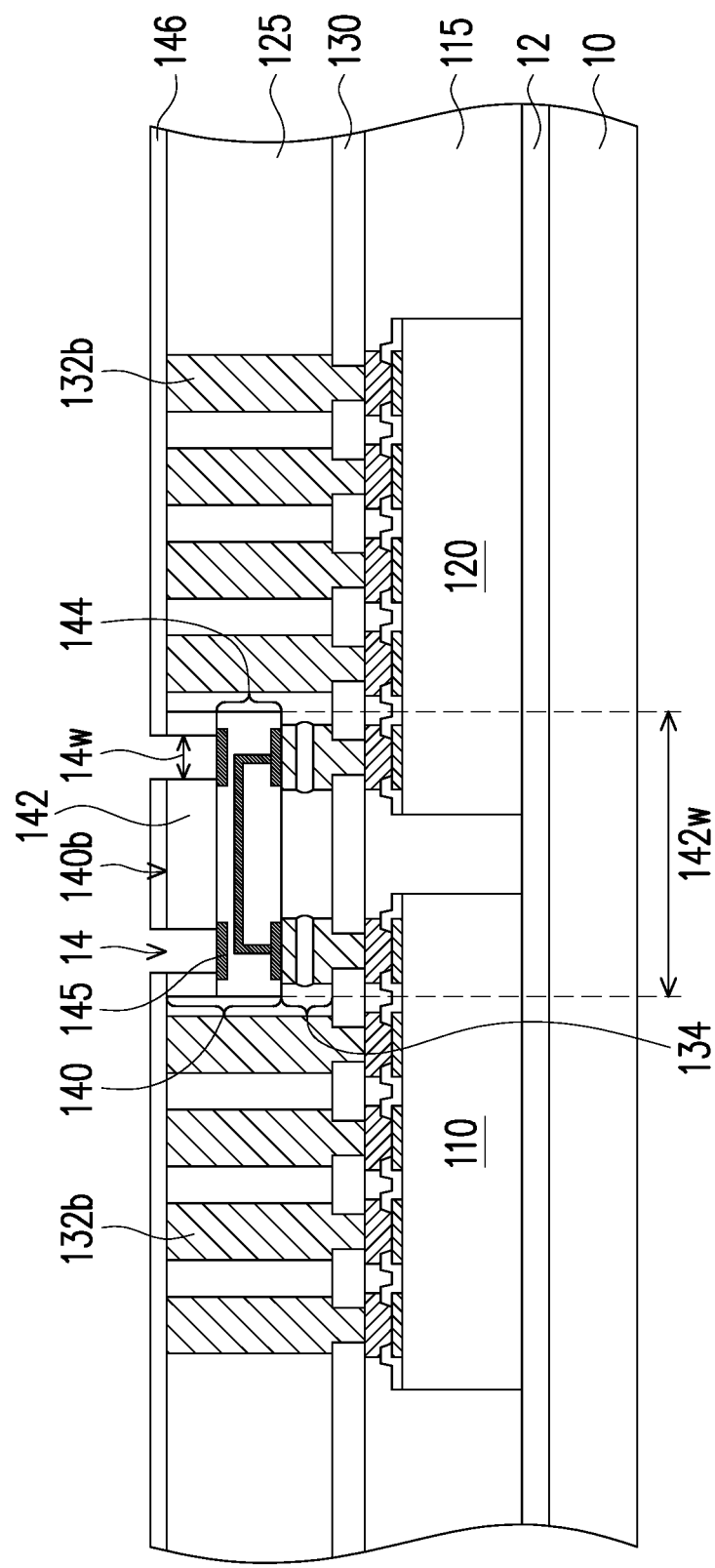

Referring to FIG. 1E and FIG. 1F, a mask pattern 146 is formed over the encapsulant 125. The mask pattern 146 has a plurality of openings corresponding the contacts 145 of the bridge structure 140. An etching process is performed by using the mask pattern 146 as an etching mask to remove a portion of the substrate 142 of the bridge structure 140, so as to form a plurality of openings 14 in the substrate 142 of the bridge structure 140. As shown in FIG. 1F, the openings 14 extend from the backside 140b of the bridge structure 140 to the interconnecting structure 144 and expose the contacts 145. In some embodiments, a width 14w of the opening 14 is 1 µm to 50 µm, and a ratio of a width 142w of the substrate 142 of the bridge structure 140 to the width 14w of the opening 14 is 10 to 2000.

In some embodiments, the etching process may be a deep reactive-ion etching (DRIE) process, such as a Bosch etching process. The Bosch etching process is carried out to form a deep, high aspect ratio trench in a selected region of the substrate. The Bosch etching process is carried out by using alternating deposition and etching cycles. For example, an etching step is performed to form a trench in the selected substrate region. In some embodiments, an etching gas introduced into the etching step may include $SF_6$ or other suitable etching gas. After forming the trench, a passivation layer is formed on sidewalls of the trench. In some embodiments, a passivating gas introduced into the passivating step may include $C_4F_8$ or other suitable passivating gas. The etching step and formation of the passivation layer are performed in successive cycles until a desired trench depth is reached. In one embodiment, after performing the Bosch etching process, the sidewalls of the openings 14 may have scalloped recesses. However, the disclosure is not limited thereto. In other embodiments, as shown in FIG. 1F, the sidewalls of the openings 14 may be flat or smooth depending on parameters of the Bosch etching process. Through the Bosch etching process, it is possible to form a high aspect ratio trench, form smooth and less-scalloped sidewalls, and achieve high speed anisotropic etching.

Figure 1G:
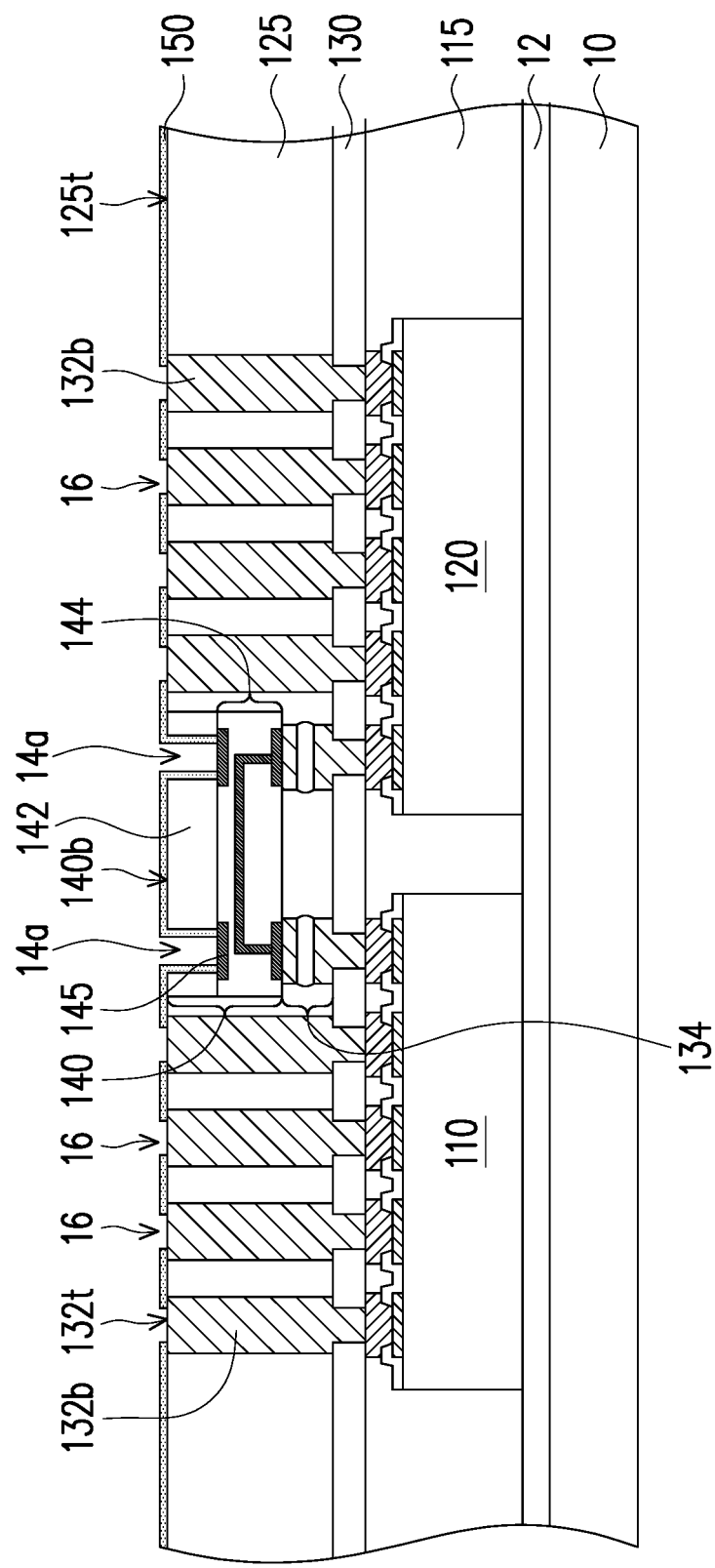

Referring to FIG. 1F and FIG. 1G, after removing the mask pattern 146, an insulating structure 150 is formed over the backside 140b of the bridge structure 140 and the top surface 125t of the encapsulant 125. In detail, the insulating structure 150 is formed by forming an insulating material to conformally cover the openings 14 and extend to cover the backside 140b of the bridge structure 140, the top surface 132t of the TIVs 132b, and the top surface 125t of the encapsulant 125, and then patterning the insulating material to form the insulating structure 150 with a plurality of openings 14a and 16. As shown in FIG. 1G, the openings 14a expose at least a portion of the contacts 145 and the openings 16 expose at least a portion of the TIVs 132b. In some embodiments, the insulating material includes polyimide, epoxy resin, acrylic resin, phenol resin, benzocyclobutene (BCB), polybenzoxazole (PBO), or any other suitable polymer-based dielectric material. In some alternative embodiments, the insulating material may include silicon oxide, silicon nitride, silicon oxy-nitride, other suitable dielectric materials, or a combination thereof. The insulating material may be formed by performing a suitable forming method, such as spin-on coating, chemical vapor deposition (CVD), plasma-enhanced chemical vapor deposition (PECVD), or the like.

Figure 1H:
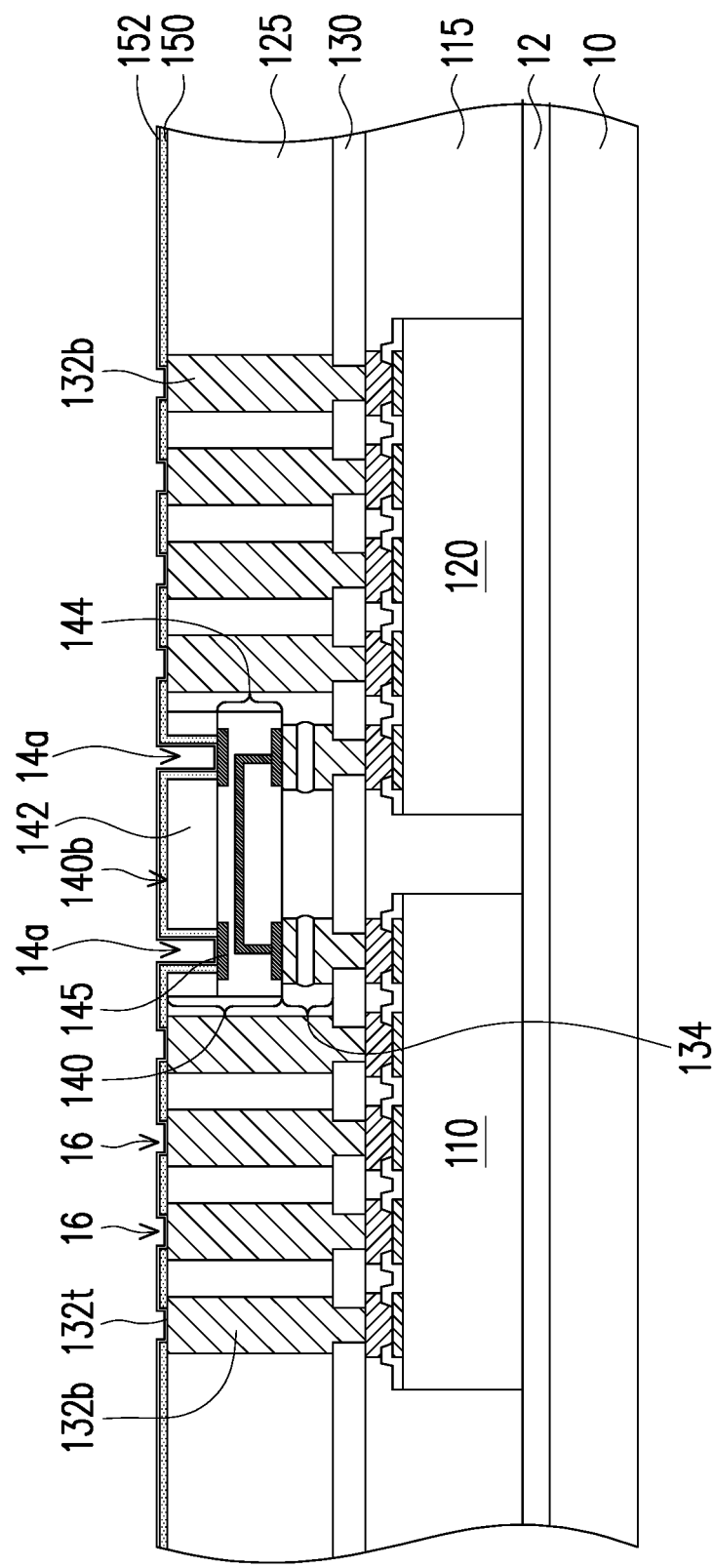

Referring to FIG. 1H, a seed layer 152 is formed over the insulating structure 150. In detail, the seed layer 152 may be a conformal seed layer to conformally cover the openings 14a, 16, and the insulating structure 150. The seed layer 152 may be formed by a CVD process or a PVD process. The PVD process is, for example, sputtering. In some embodiments, the seed layer 152 is a metal layer, which may be a single layer or a composite layer including a plurality of sub-layers formed of different materials. In other embodiments, the seed layer 152 is, for example, a titanium/copper composited layer, wherein the sputtered titanium thin film is in contact the contacts 145 and the TIVs 132b, and the sputtered copper thin film is then formed over the sputtered titanium thin film. In some alternative embodiments, the seed layer 152 may be other suitable composited layer such as metal, alloy, barrier metal, or a combination thereof.

Figure 1I:
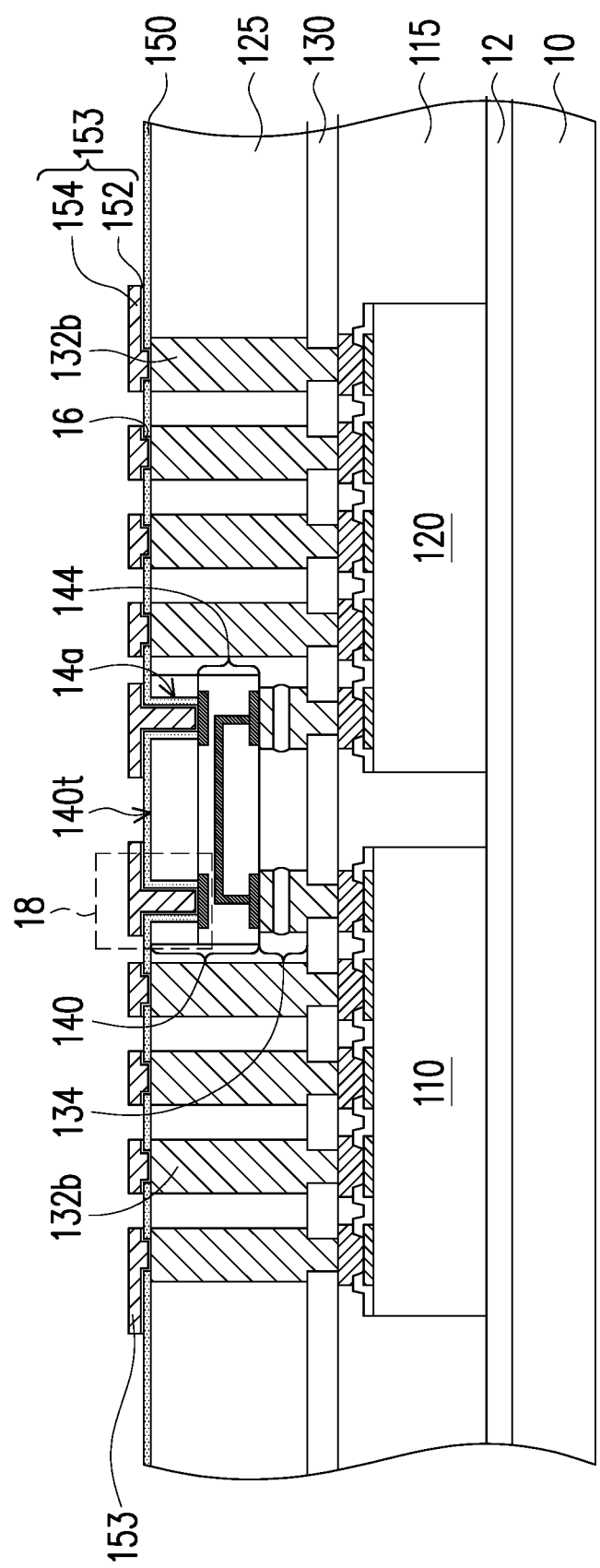
Figure 1J:
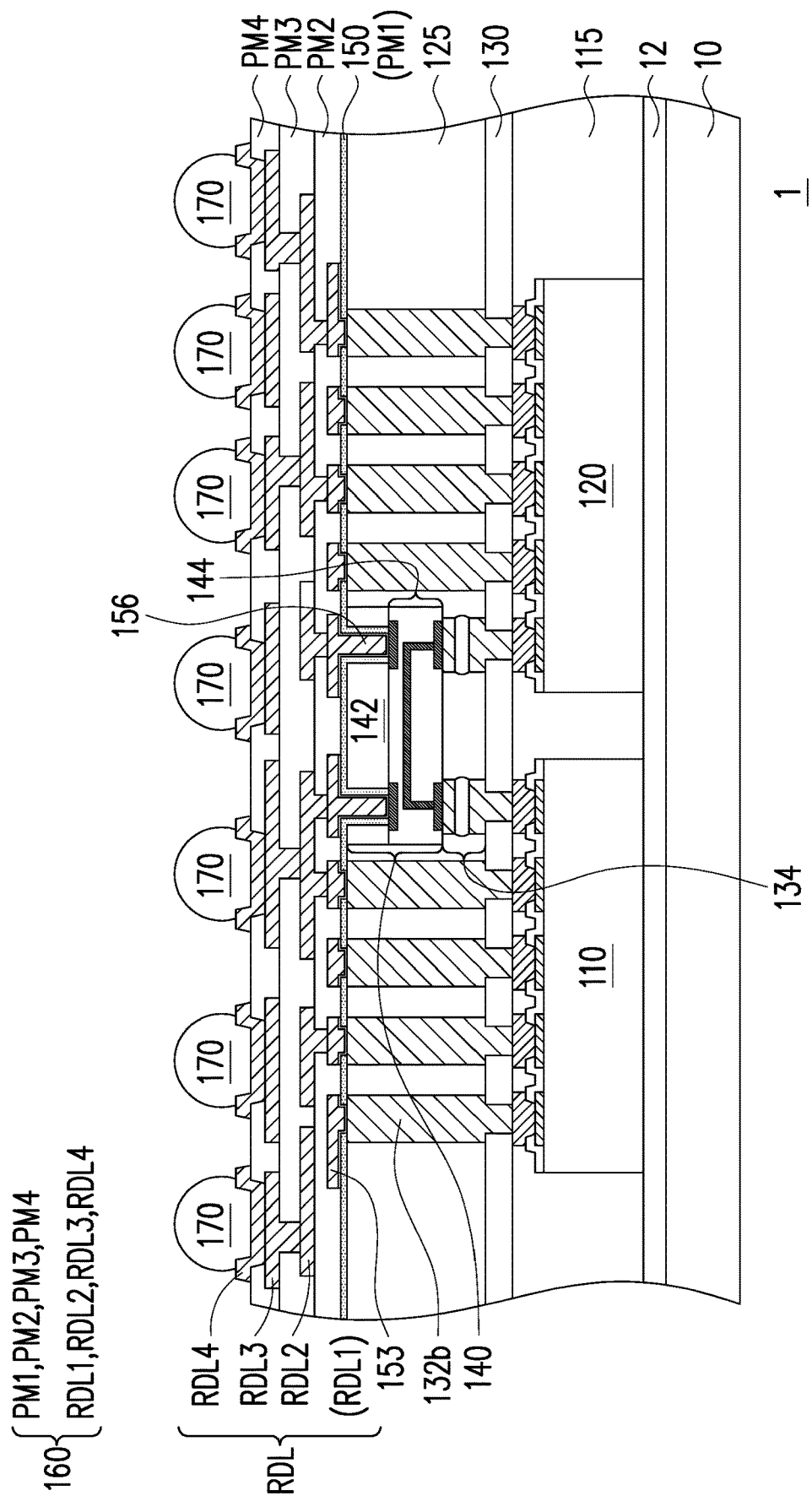

Referring to FIG. 1H and FIG. 1I, after forming the seed layer 152, one or more patterned masks having a plurality of openings corresponding to the contacts 145 and the TIVs 132b are formed, a conductive material is filled in the openings, the patterned masks are removed, and a portion of the seed layer 152 uncovered by the conductive material is removed, so as to form a conductive feature 154. In some embodiments, the conductive material includes metal, such as copper, nickel, titanium, a combination thereof or the like, and are formed by an electroplating process. In some alternatively embodiments, the conductive material is formed by a CVD process or a PVD process. The PVD process is, for example, sputtering.

Herein, as shown in FIG. 1I, the seed layer 152 and the conductive feature 154 over the seed layer 152 constitute a conductive pattern 153. A portion of the conductive pattern 153 is filled in the openings 14a to electrically connect to the contacts 145. Another portion of the conductive pattern 153 is filled in the openings 16 to electrically connect to the TIVs 132b.

Figure 2A:
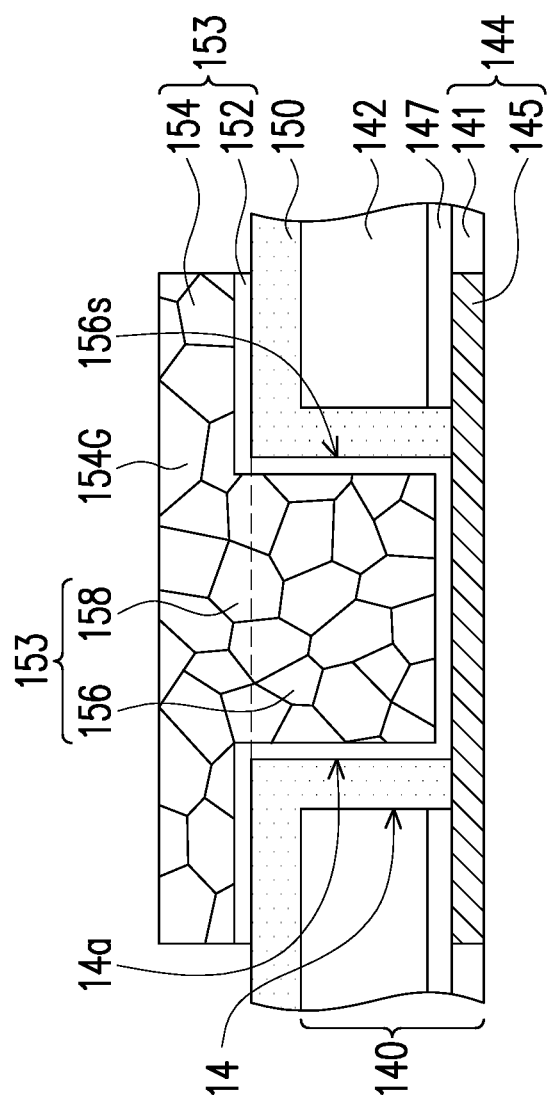
FIG. 2A to FIG. 2D are various enlarged views of a region of FIG. 1I.
Figure 2B:
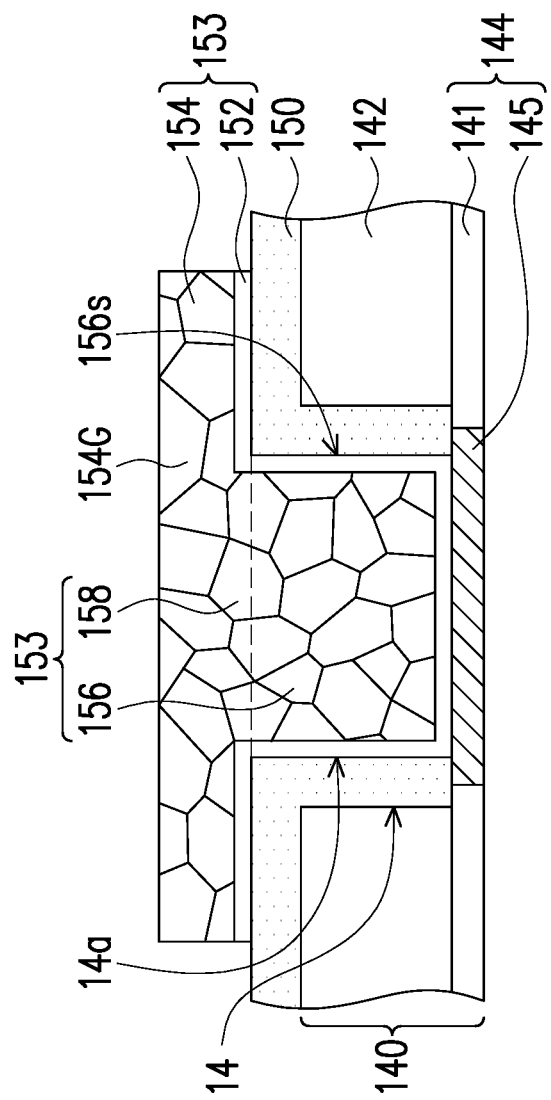

FIGS. 2A to 2D illustrate the enlarged views of the region 18 shown in FIG. 1I in accordance with some embodiments. Specifically, as shown in the enlarged view shown in FIG. 2A illustrating a region 18 of FIG. 1I, the portion of the conductive pattern 153 over the openings 14a may include a through via 156 and a redistribution layer (RDL) 158 over the through via 156. Herein, the through via 156 includes the seed layer 152 conformally covering a bottom surface and sidewalls of the opening 14a and the conductive feature 154 filled in the opening 14a. The seed layer 152 is in (physical) contact with the contacts 145 at the bottom surface of the opening 14a. Since the through via 156 penetrates through the substrate 142, the through via 156 in the opening 14a is referred to as a through substrate via (TSV) 156. On the other hands, the RDL 158 may include the seed layer 152 outside the opening 14a and the conductive feature 154 over the TSV 156. That is to say, the whole seed layer 152 extends from the bottom surface of the opening 14a and the sidewalls of the opening 14a to cover a portion of the top surface of the insulating structure 150, and the conductive feature 154 is disposed on the seed layer 152. As shown in FIG. 2A, the insulating structure 150 laterally encapsulates the TSV 156 to electrically isolate the TSV 156 from the substrate 142 of the bridge structure 140. In one embodiment, another dielectric layer 147 (as shown in FIG. 2A) is disposed between the substrate 142 and the contacts 145 to separate the substrate 142 from the contacts 145. In the case, the dielectric layer 147 may be referred to as an etching stop layer for forming the openings 14 (as shown in FIG. 1F). The dielectric layer 147 may include a dielectric material, such as silicon oxide, silicon nitride, silicon oxy-nitride, other suitable dielectric materials, or a combination thereof. In another embodiment, as shown in FIG. 2B, a width of the contact 145 may be less than a width of the opening 14 or less than a width of the TSV 156, which means the contact 145 is within the region of the corresponding opening 14, so that the contacts 145 would not be in contact with the substrate 142. It should be noted that, in some embodiments, the conductive feature 154 of the RDL 158 is in contact with the conductive feature 154 of the TSV 156. As shown in FIG. 2A to FIG. 2D, the seed layer 152 is free of between the conductive feature 154 of the RDL 158 and the conductive feature 154 of the TSV 156. In other words, as shown in FIG. 2A to FIG. 2D, a plurality of metal grains 154G are included and distributed in the conductive feature 154, and the RDL 158 and the TSV 156 share at least one of the plurality of metal grains 154G. That is, the RDL 158 and the TSV 156 are formed simultaneously or in a same process.

Figure 2C:
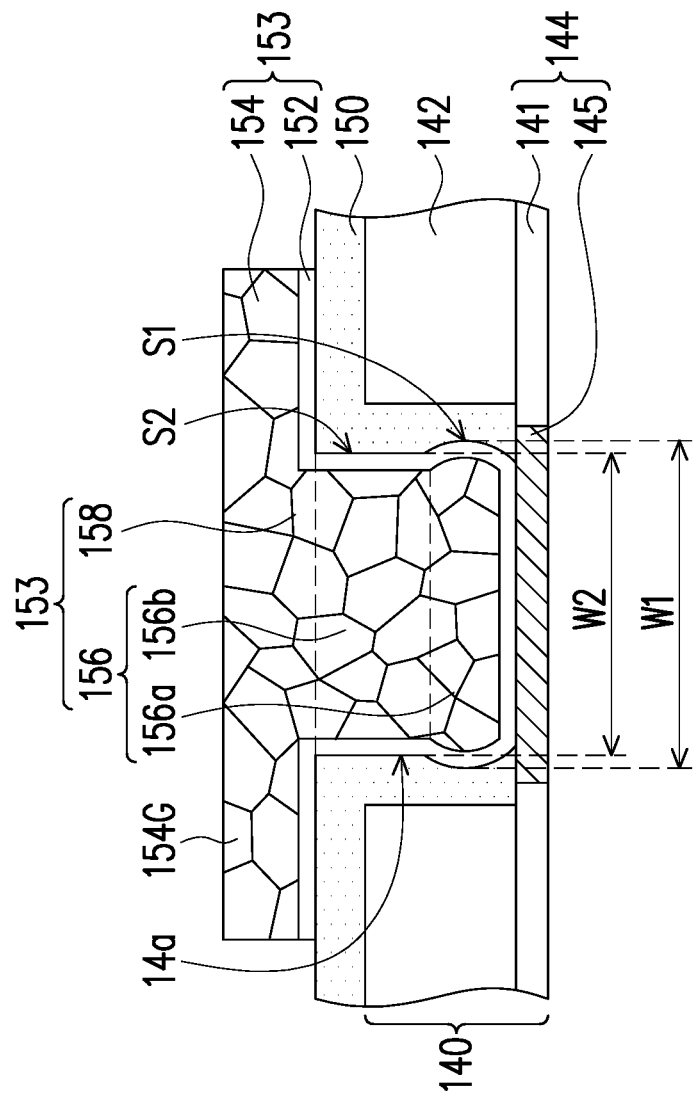
Figure 2D:
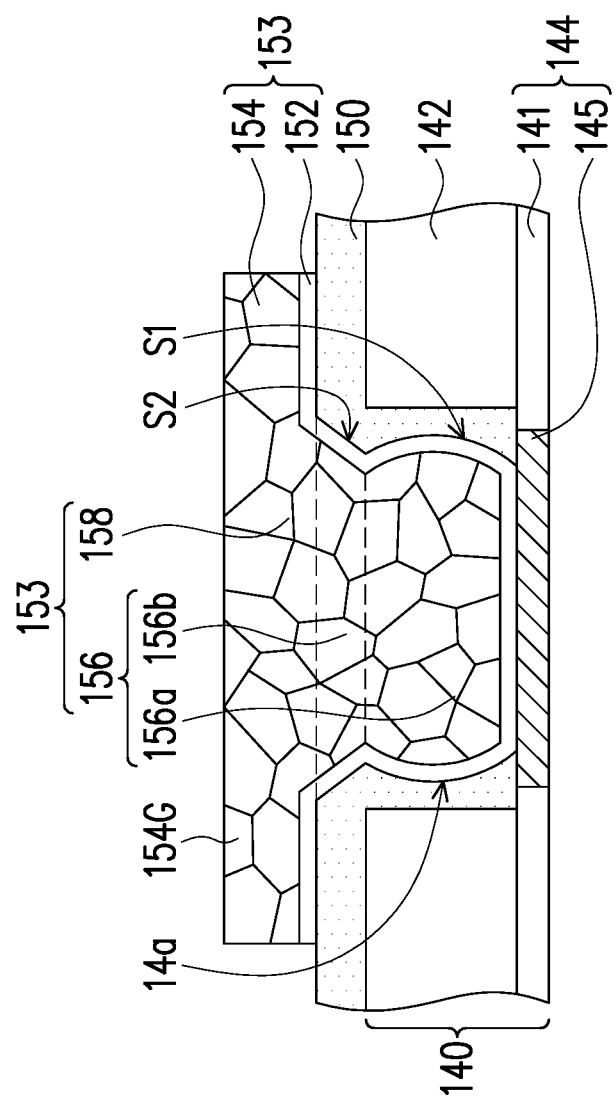

In some embodiments, as shown in FIG. 2A and FIG. 2B, the TSV 156 has a uniform width, namely, sidewalls 156s of the TSV 156 are substantially perpendicular to the top surface of the contact 145. However, the disclosure is not limited thereto. In some alternative embodiments, as shown in FIG. 2C, the TSV 156 may include a lower portion 156a and an upper portion 156b over the lower portion 156a. A sidewall S1 of the lower portion 156a has an arc profile or curved profile, while a sidewall S2 of the upper portion 156b has a straight profile substantially perpendicular to the top surface of the contact 145. In the case, a width W1 of the lower portion 156a is greater than or equal to a width W2 of the upper portion 156b. The arc sidewall S1 of the lower portion 156a may be formed by performing exposure and development processes on the insulating material (e.g., a photosensitive material) to form the insulating structure 150. In other embodiments, as shown in FIG. 2D, a sidewall S1 of the lower portion 156a has an arc profile or curved profile, while a sidewall S2 of the upper portion 156b has a tilted profile which is obtuse with the top surface of the contact 145.

Referring to FIG. 1I and FIG. 1J, after forming the conductive pattern 153, a redistribution layer (RDL) structure 160 is formed on the encapsulant 125 and the top surface 140t of the bridge structure 140. The RDL structure 160 is electrically connected to the first die 110 and the second die 120 through the TIVs 132b. In some embodiments, the first die 110 is electrically connected to the second die 120 through the bonding structure 134 and the bridge structure 140. In some alternative embodiments, the first die 110 is electrically connected to the second die 120 through the TIVs 132b and the RDL structure 160. In addition, the RDL structure 160 is electrically connected to the bridge structure 140 through the TSVs 156. In some embodiments, the RDL structure 160 includes a plurality of polymer layers PM1, PM2, PM3, and PM4 and a plurality of redistribution layers RDL1, RDL2, RDL3, and RDL4 stacked alternately. The number of the polymer layers or the redistribution layers is not limited by the disclosure.

In some embodiments, the said conductive pattern 153 is referred to as the redistribution layer RDL1 and the said insulating structure 150 is referred to as the polymer layer PM1. A portion of the redistribution layer RDL1 penetrates through the polymer layer PM1 to electrically connect to the TIVs 132b, and another portion of the redistribution layer RDL1 penetrates through the polymer layer PM1 and the substrate 142 to electrically connect to the interconnecting structure 144 of the bridge structure 140. The redistribution layer RDL2 penetrates through the polymer layer PM2 and is electrically connected to the redistribution layer RDL1.

The redistribution layer RDL3 penetrates through the polymer layer PM3 and is electrically connected to the redistribution layer RDL2. The redistribution layer RDL4 penetrates through the polymer layer PM4 and is electrically connected to the redistribution layer RDL3. In some embodiments, the polymer layers PM2, PM3, and PM4 include a photo-sensitive material such as polybenzoxazole (PBO), polyimide (PI), benzocyclobutene (BCB), a combination thereof or the like. In some embodiments, the redistribution layers RDL2, RDL3, and RDL4 include conductive materials. The conductive materials include metal such as copper, nickel, titanium, a combination thereof or the like, and are formed by an electroplating process. In some embodiments, the redistribution layers RDL2, RDL3, and RDL4 respectively includes a seed layer (not shown) and a metal layer formed thereon (not shown). The seed layer may be a metal seed layer such as a copper seed layer. In some embodiments, the seed layer includes a first metal layer such as a titanium layer and a second metal layer such as a copper layer over the first metal layer. The metal layer may be copper or other suitable metals. In some embodiments, the redistribution layers RDL2, RDL3, and RDL4 respectively includes a plurality of vias and a plurality of traces connected to each other. The vias penetrate through the polymer layers PM2, PM3 and PM4 and connect to the traces, and the traces are respectively located on the polymer layers PM2, PM3, and PM4, and are respectively extending on the top surfaces of the polymer layers PM2, PM3, and PM4. In some embodiments, the topmost redistribution layer RDL4 is also referred as under-ball metallurgy (UBM) layer for ball mounting.

Thereafter, a plurality of conductive terminals 170 are formed over and electrically connected to the redistribution layer RDL4 of the RDL structure 160. In some embodiments, the conductive terminals 170 are made of a conductive material with low resistivity, such as Sn, Pb, Ag, Cu, Ni, Bi or an alloy thereof, and are formed by a suitable process such as evaporation, plating, ball drop, screen printing, or a ball mounting process. The conductive terminals 170 are electrically connected to the first die 110 and the second die 120 through the RDL structure 160 and the TIVs 132b. The conductive terminals 170 are electrically connected to the bridge structure 140 through the RDL structure 160. After forming the conductive terminals 170, the package 1 of the first embodiment is formed.

Figure 3:
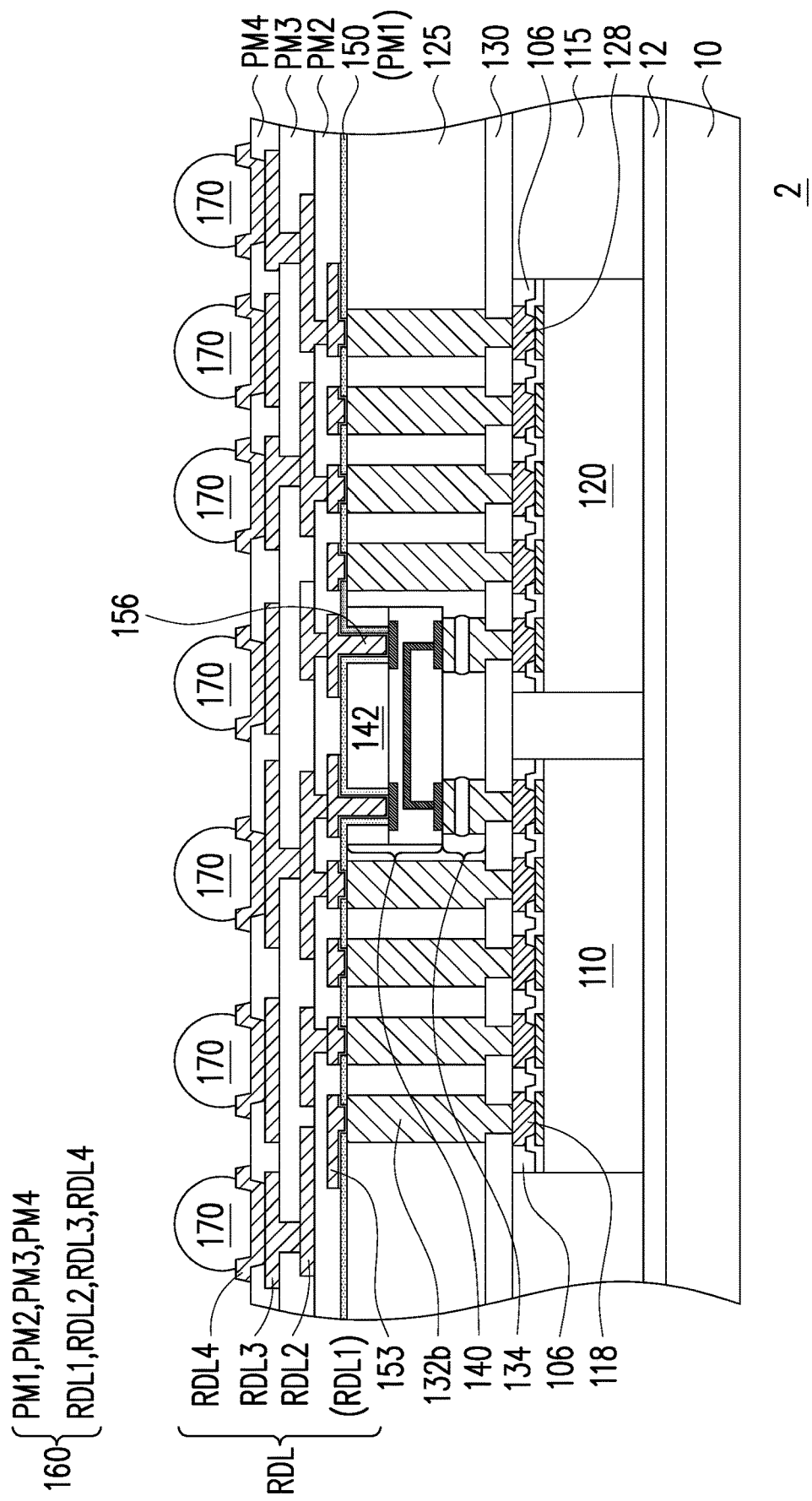
FIG. 3 is a schematic cross-sectional view illustrating a package according to a second embodiment of the disclosure.

FIG. 3 is a schematic cross-sectional view illustrating a package according to a second embodiment of the disclosure.

Referring to FIG. 3, the arrangement, material and forming method of a package 2 are similar to the arrangement, material and forming method of the package 1 and has been described in detail in the above embodiments. Thus, details thereof are omitted here. A difference therebetween lies in that the first die 110 and the second die 120 of the package 2 further have a passivation layer 106 laterally encapsulating and protecting the connectors 118 and 128. In other words, the passivation layer 106 is disposed between connectors 118, between connectors 128, between the encapsulant 115 and the connectors 118, and between the encapsulate 115 and the connectors 128. In some embodiments, the top surface of the passivation layer 106, the connectors 118 and 128 may be substantially coplanar with a top surface of the encapsulate 115.

In some embodiments, the passivation layer 106 may include polyimide, epoxy resin, acrylic resin, phenol resin, benzocyclobutene (BCB), polybenzoxazole (PBO), or any other suitable polymer-based dielectric material. In some alternative embodiments, the passivation layer 106 may be a single layer or a multi-layered structure, including a silicon oxide layer, a silicon nitride layer, a silicon oxy-nitride layer, a dielectric layer formed by other suitable dielectric materials or a combination thereof. In other embodiments, one of the first die 110 and the second die 120 has the passivation layer 106, while the other of the first die 110 and the second die 120 is free of the passivation layer 106.

FIG. 4A to FIG. 4D are schematic cross-sectional views illustrating a method of manufacturing a package according to a third embodiment of the disclosure.

Figure 4A:
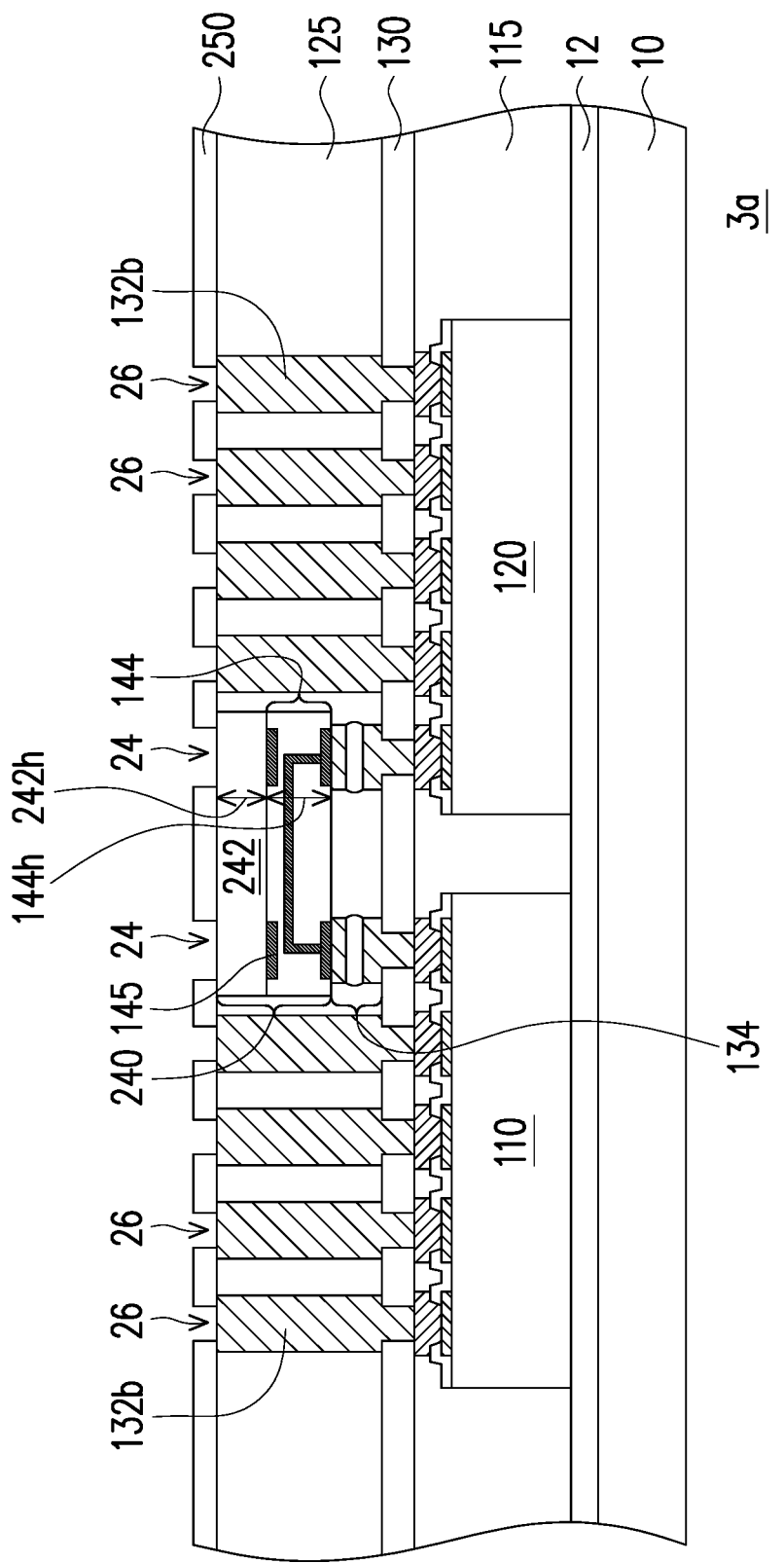
FIG. 4A to FIG. 4D are schematic cross-sectional views illustrating a method of manufacturing a package according to a third embodiment of the disclosure.

Referring to FIG. 4A, a structure 3a follows the structure illustrated in FIG. 1E. After forming the structure illustrated in FIG. 1E, an insulating material 250 is formed and patterned to form a plurality of openings 24 and 26. The openings 24 correspond to the contacts 145 and the openings 26 correspond to the TIVs 132b. In some embodiments, the insulating material 250 may include polyimide, epoxy resin, acrylic resin, phenol resin, benzocyclobutene (BCB), polybenzoxazole (PBO), or any other suitable polymer-based dielectric material. In some alternative embodiments, the insulating material 250 may include silicon oxide, silicon nitride, silicon oxy-nitride, other suitable dielectric materials or a combination thereof. In some embodiments, the insulating material 250 and the insulating structure 150 may have a same material or different materials.

It should be noted that the substrate 242 and the substrate 142 may have different materials. In some embodiments, the substrate 242 of a bridge structure 240 is made of a dielectric material, such as silicon oxide, silicon nitride, silicon oxy-nitride, or the like, or a combination thereof. In some alternative embodiments, a thickness 242h of the substrate 242 is 5 μm to 200 μm, a thickness 144h of the interconnecting structure 144 is 1 μm to 20 μm, and a ratio of the thickness 242h of the substrate 242 to the thickness 144h of the interconnecting structure 144 is 0.1 to 200.

Figure 4B:
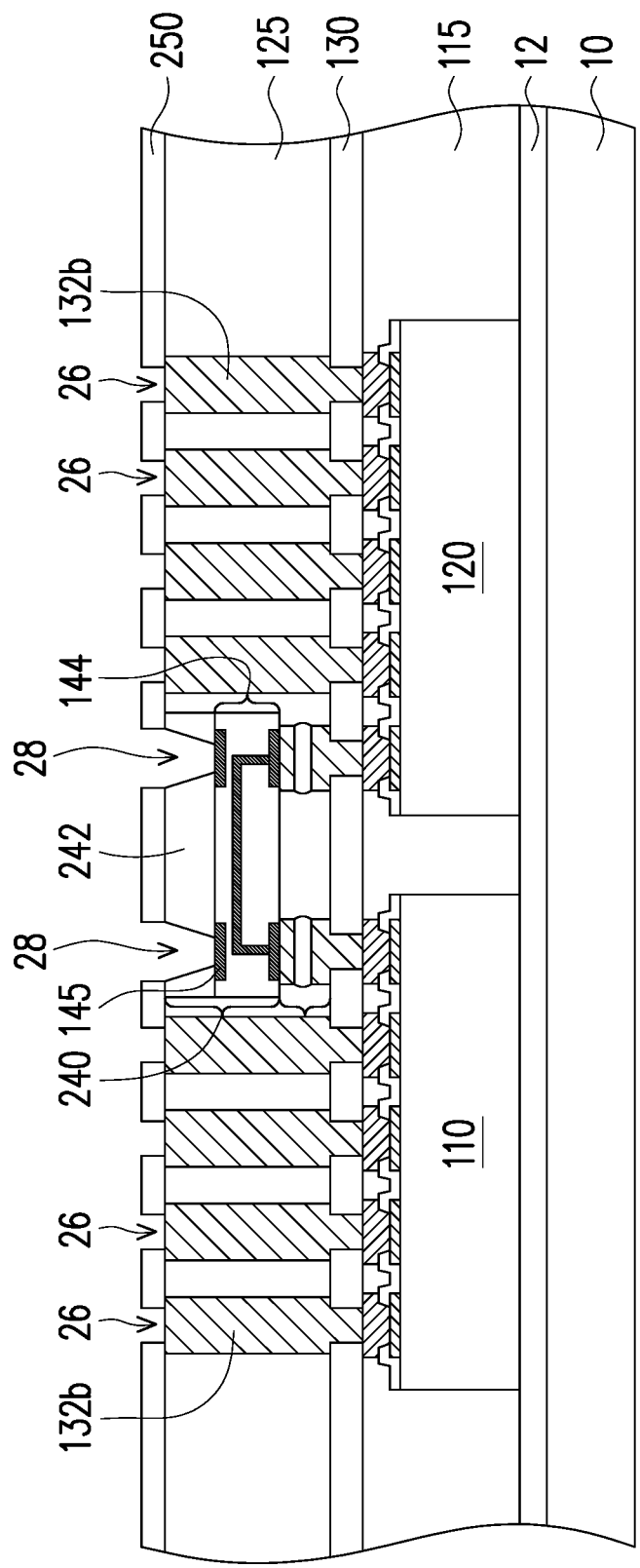

Referring to FIG. 4A and FIG. 4B, an anisotropic etching process is performed to remove a portion of the substrate 242 of the bridge structure 240 by using the insulating material 250 as the etching mask, so as to form a plurality of openings 28 in the substrate 242. The substrate 242 and the insulating material 250 have a high etching selectivity during the anisotropic etching process. That is, only few amount of the insulating material 250 is removed when the portion of the substrate 242 is removed. As shown in FIG. 4B, an upper width of one of the openings 28 is greater than a lower width thereof.

Figure 4C:
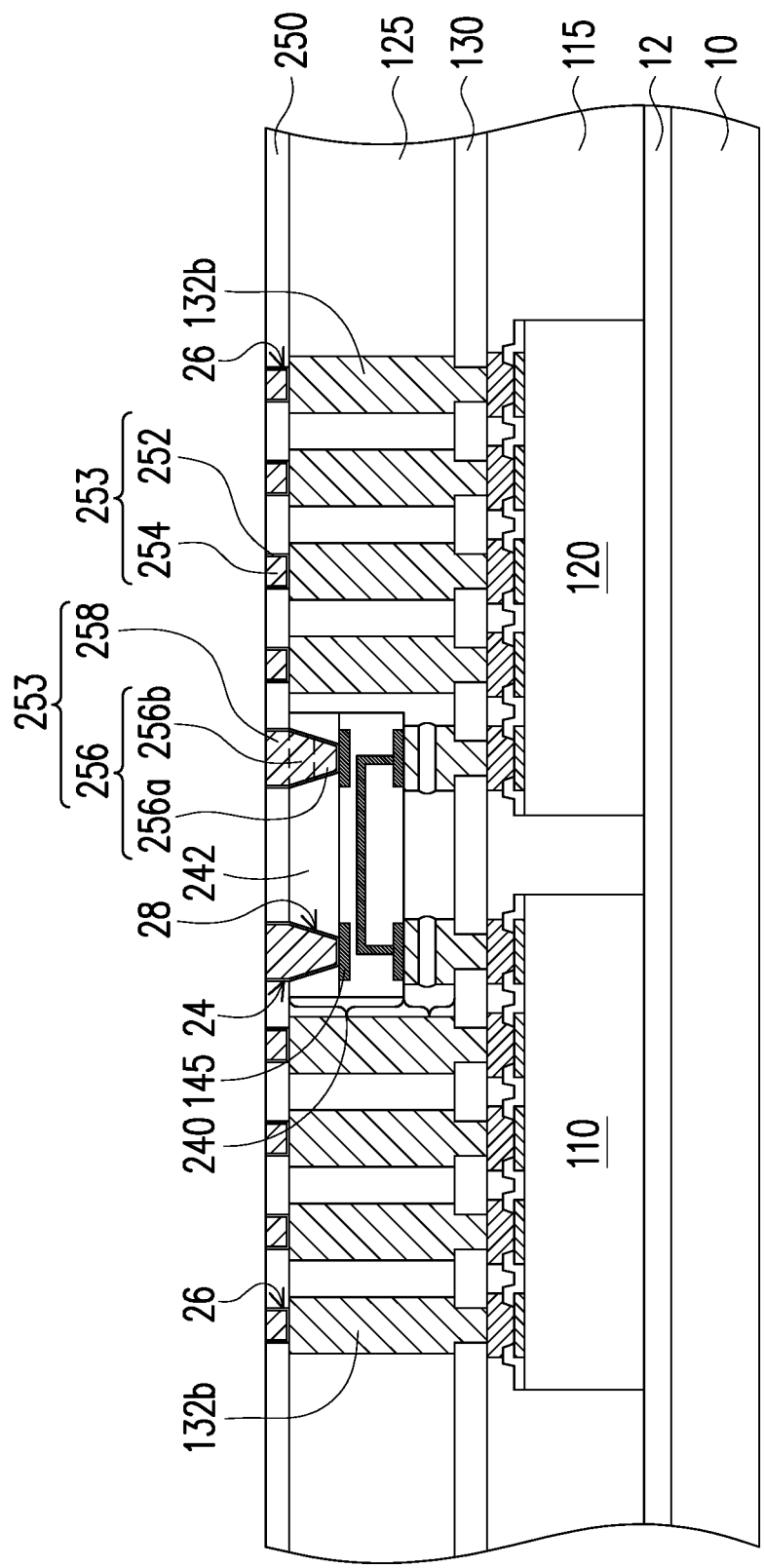

Referring to FIG. 4B and FIG. 4C, a conductive pattern 253 is formed in the openings 24, 26, 28. In detail, the seed layer 252 may be a conformal seed layer to conformally cover the openings 24, 26, 28, and the insulating material 250. After forming the seed layer 252, a conductive material is filled in the openings 24, 26, 28, and portions of the conductive material and the seed layer 252 over the top surface of the insulating material 250 are removed, so as to form the conductive pattern 253. In some embodiments, the conductive pattern 253 may include the seed layer 252 and the conductive feature 254 over the seed layer 252. A portion of the conductive pattern 253 is filled in the openings 24, 28 to electrically connect to the contacts 145. Another portion of the conductive pattern 253 is filled in the openings 26 to electrically connect to the TIVs 132b. The portion of the conductive pattern 253 in the openings 24 and 28 may include a through via 256 and a RDL 258 over the through via 256. Herein, the through via 256 includes the seed layer 252 conformally covering the opening 28 and the conductive feature 254 filled in the opening 28. Since the through via 256 penetrates through the substrate 242, the through via 256 in the opening 28 is referred to as a through substrate via (TSV) 256. On the other hands, the RDL 258 may include the seed layer 252 in the opening 24 and the conductive feature 254 over the TSV 256. It should be noted that, as shown in FIG. 4C, no insulating structure extends into the openings 28 to laterally encapsulate the TSVs 256. Since the substrate 242 is made of the dielectric material, the TSVs 256 may penetrate through the substrate 242, so that the TSVs 256 are electrically or physically isolated from each other by the substrate 242. Accordingly, compared with the method illustrated in FIG. 1A to FIG. 1J, the steps of forming the insulating structure filling in the openings can be omitted in the method of FIG. 4A to FIG. 4C, thereby simplifying the manufacturing steps and saving the process cost.

As shown in FIG. 4C, the TSVs 256 electrically connect to and contact with the contacts 145. In detail, one of the TSVs 256 has a lower portion 256a and an upper portion 256b, wherein a width of the upper portion 256b is greater than a width of the lower portion 256a. That is, one of the TSVs 256 has a trapezoidal profile. In other words, the one of the TSVs 256 has tilted sidewalls.

Figure 4D:
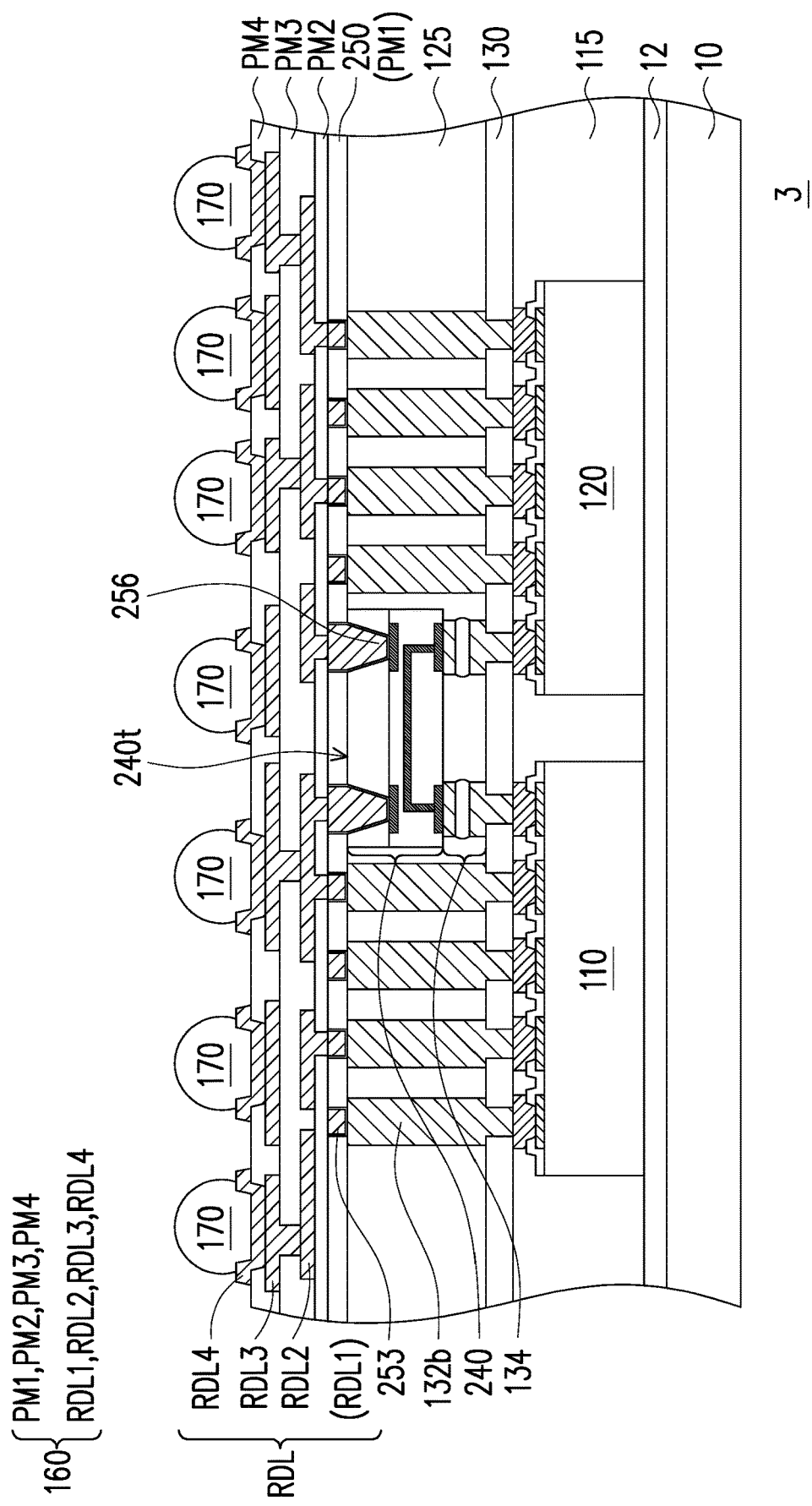

Referring to FIG. 4C and FIG. 4D, after forming the conductive pattern 253, a RDL structure 160 is formed on the encapsulant 125 and the top surface 240t of the bridge structure 240. Thereafter, a plurality of conductive terminals 170 are formed over and electrically connected to the redistribution layer RDL4 of the RDL structure 160. The arrangement, material and forming method of the RDL structure 160 and the conductive terminals 170 have been described in detail in the above embodiments. Thus, details thereof are omitted here. After forming the conductive terminals 170, the package 3 of the third embodiment is formed.

In view of the foregoing, in the embodiment, the through via 156 or 256 and the redistribution layer RDL1 are formed in a same process. Accordingly, the step of the redistribution layer RDL1 overlapping with the through via 156 can be omitted. In the case, the process window of forming the through via 156 or 256 is increased, thereby enhancing the yield. In addition, the steps of forming the through via 156 or 256 and the redistribution layer RDL1 are simplified, thereby saving the process cost and achieving high throughput.

FIG. 5A to FIG. 5G are schematic cross-sectional views illustrating a method of manufacturing a package structure according to a fourth embodiment of the disclosure.

Figure 5A:
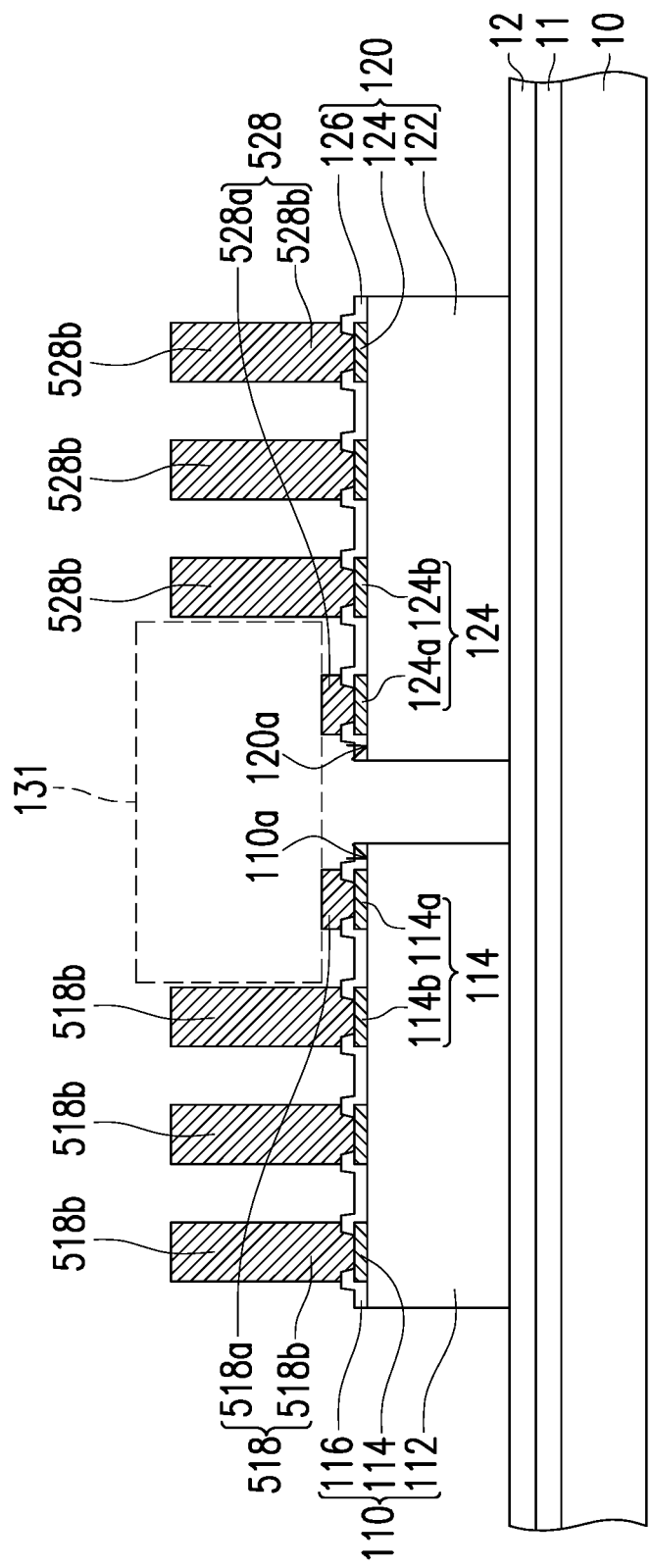
FIG. 5A to FIG. 5G are schematic cross-sectional views illustrating a method of manufacturing a package structure according to a fourth embodiment of the disclosure.

Referring to FIG. 5A, a carrier 10 is provided. A de-bonding layer 11 is formed on the carrier 10. A first die 110 and a second die 120 are attached side by side to the de-bonding layer 11 over the carrier 10 through an adhesive layer 12, such as a die attach film (DAF). The arrangement, material and forming method of the first die 110 and the second die 120 have been described in detail in the above embodiments. Thus, details thereof are omitted here. In the present embodiment, the first die 110 is different from the second die 120. For example, the first die 110 may be a system-on-chip (SoC), while the second die 120 may be a package, such as a memory package. In some embodiments, the memory package may include memory dies, such as dynamic random access memory (DRAM) dies, static random access memory (SRAM) dies, High-Bandwidth Memory (HBM) dies, Hybrid Memory Cubes (HMC) dies, or the like, or a combination thereof. In some alternative embodiments, the second die 120 may include both memory dies and a memory controller, such as, for example, a stack of four or eight memory dies with a memory controller.

Figure 6:
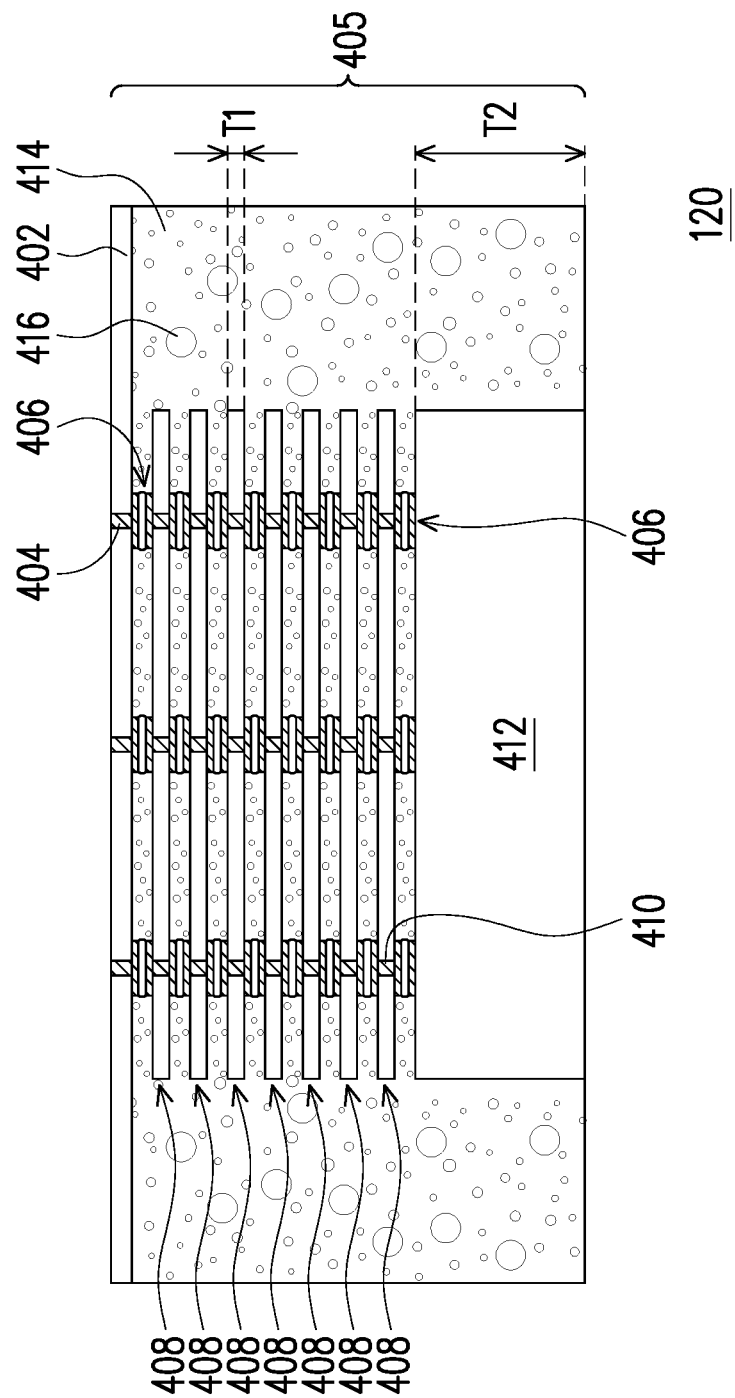
FIG. 6 is an enlarged view of a memory package of FIG. 5A.

Specifically, as shown in FIG. 6, the following paragraph use the HBM as the second die 120 to illustrate. In FIG. 6, the second die 120 may include a main body 405. The main body 405 may include a plurality of stacked memory dies 408 and a bottom die 412. The stacked memory dies 408 may all be identical dies. Alternatively, the memory dies 408 may include dies of different types and/or structures. Each memory die 408 is connected to an overlying memory die 408 and/or an underlying memory die 408 by a plurality of connectors 406. The connectors 406 may be micro bumps or other suitable connectors. The memory dies 408 may include through vias 410 that connect underlying connectors 406 to overlying connectors 406. In some embodiment, the memory dies 408 each have a thickness T1 in a range from about 10 μm to about 775 μm, such as about 50 μm. The number of the memory dies 408 is not limited in this disclosure. In some alternative embodiments, the number of the memory dies 408 may be adjusted depending on actual design needs.

In some embodiments, the main body 405 may include HBM and/or hybrid memory cube (HMC) modules, which may include one or more memory dies 408 connected to a logic die 402. The logic die 402 may include through vias 404 that connect a conductive feature of an interconnection region (not shown) to an underlying connector 406 and memory dies 408. In some embodiments, the logic die 402 may be a memory controller.

Figure 7:
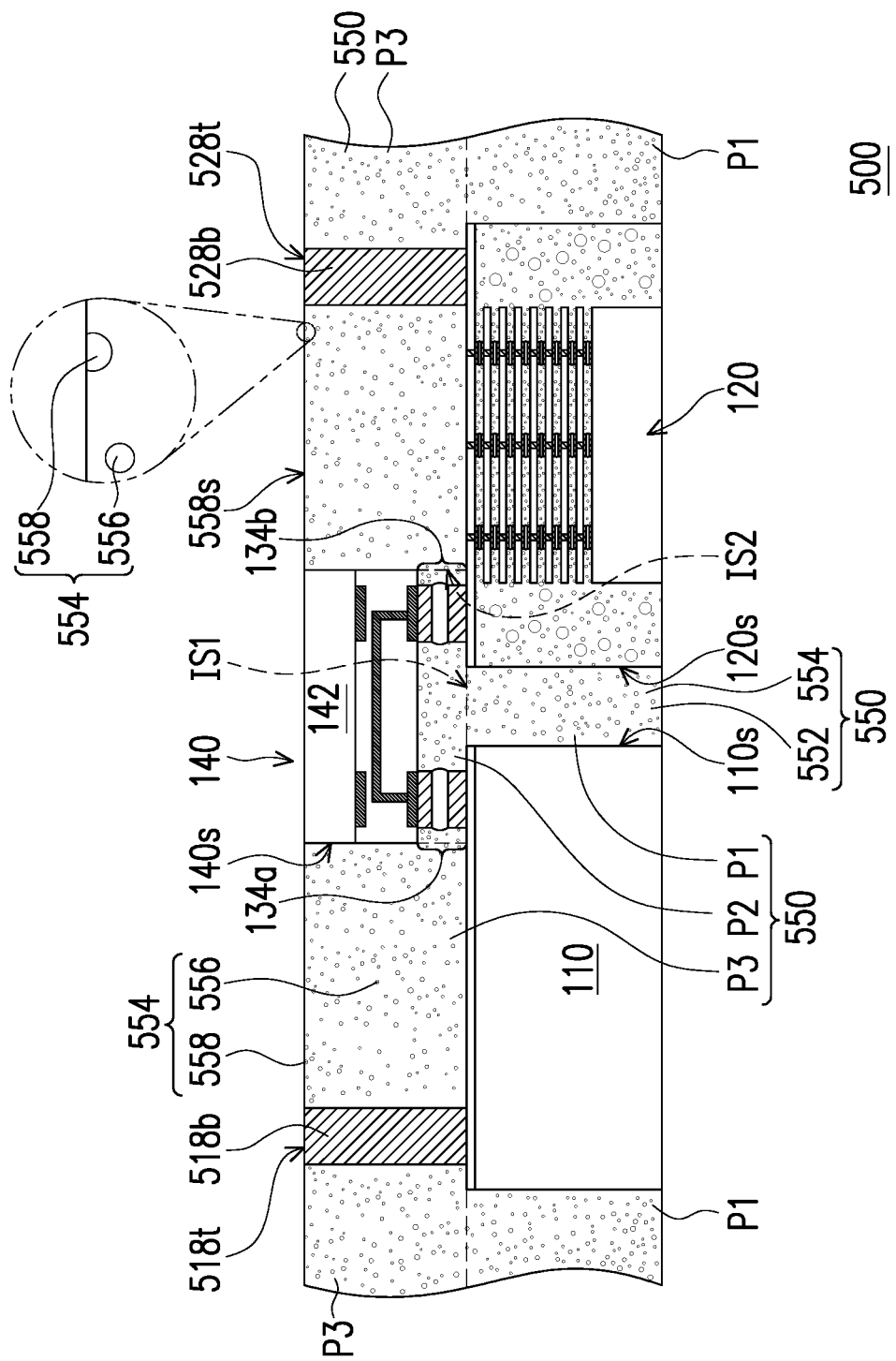
FIG. 7 is an enlarged view of a portion of the package structure of FIG. 5D.

The bottom die 412 may be a similar die (in function and circuitry) to the memory dies 408 except that the bottom die 412 is thicker than the memory dies 408. In some embodiments, the bottom die 412 may be a dummy die. In some alternative embodiments, the bottom die 412 has a thickness T2 in a range from about 10 μm to about 775 μm, such as about 200 μm. As shown in FIG. 6, the main body 405 may be encapsulated in an encapsulant 414. The encapsulant 414 may include a molding compound, a molding underfill, an epoxy, or a resin. In detail, the encapsulant 414 has a base material and a plurality of filler particles 416 in the base material. In some embodiments, a (average) particle size of the filler particles 416 in the encapsulant 414 is greater than a (average) particle size of the filler particles 554 in the encapsulant 550 (as shown in FIG. 7). With the particle size of the filler particles 416 in the encapsulant 414 being greater than the particle size of the filler particles 554 in the encapsulant 550, it is possible to have better warpage control for a package or wafer form and lower the cost for non-gap filling applications. However, the disclosure is not limited thereto, in other embodiments, the (average) particle size of the filler particles in the encapsulant 414 is equal to or less than the (average) particle size of the filler particles in the encapsulant 550 (as shown in FIG. 7).

Referring back to FIG. 5A, a plurality of conductive vias 518 are further disposed on the conductive pads 114. Herein, the conductive vias 518 is equivalent to the conductive vias 132 (shown in FIG. 1C), and the conductive vias 518 are in contact with the conductive pads 114. The conductive vias 518 includes the first conductive via 518a on the first conductive pad 114a and the second conductive vias 518b on the second conductive pads 114b. In some embodiments, a height of the first conductive via 518a is less than a height of the second conductive vias 518b. Similarly, a plurality of conductive vias 528 are further disposed on the conductive pads 124. Herein, the conductive vias 528 is equivalent to the conductive vias 132, and the conductive vias 528 are in contact with the conductive pads 124. The conductive vias 528 includes a first conductive via 528a on the first conductive pad 124a and a second conductive vias 528b on the second conductive pads 124b. In some embodiments, a height of the first conductive via 528a is less than a height of the second conductive vias 528b.

After the first die 110 and the second die 120 are disposed side by side and on the adhesive layer 12, as shown in FIG. 5A, an accommodation space 131 is surrounded or built-up by the first conductive vias 518a, 528a and the second conductive vias 518b, 528b. In some embodiments, the accommodation space 131 is used to mount a bridge structure 140 (as shown in FIG. 5B).

Figure 5B:
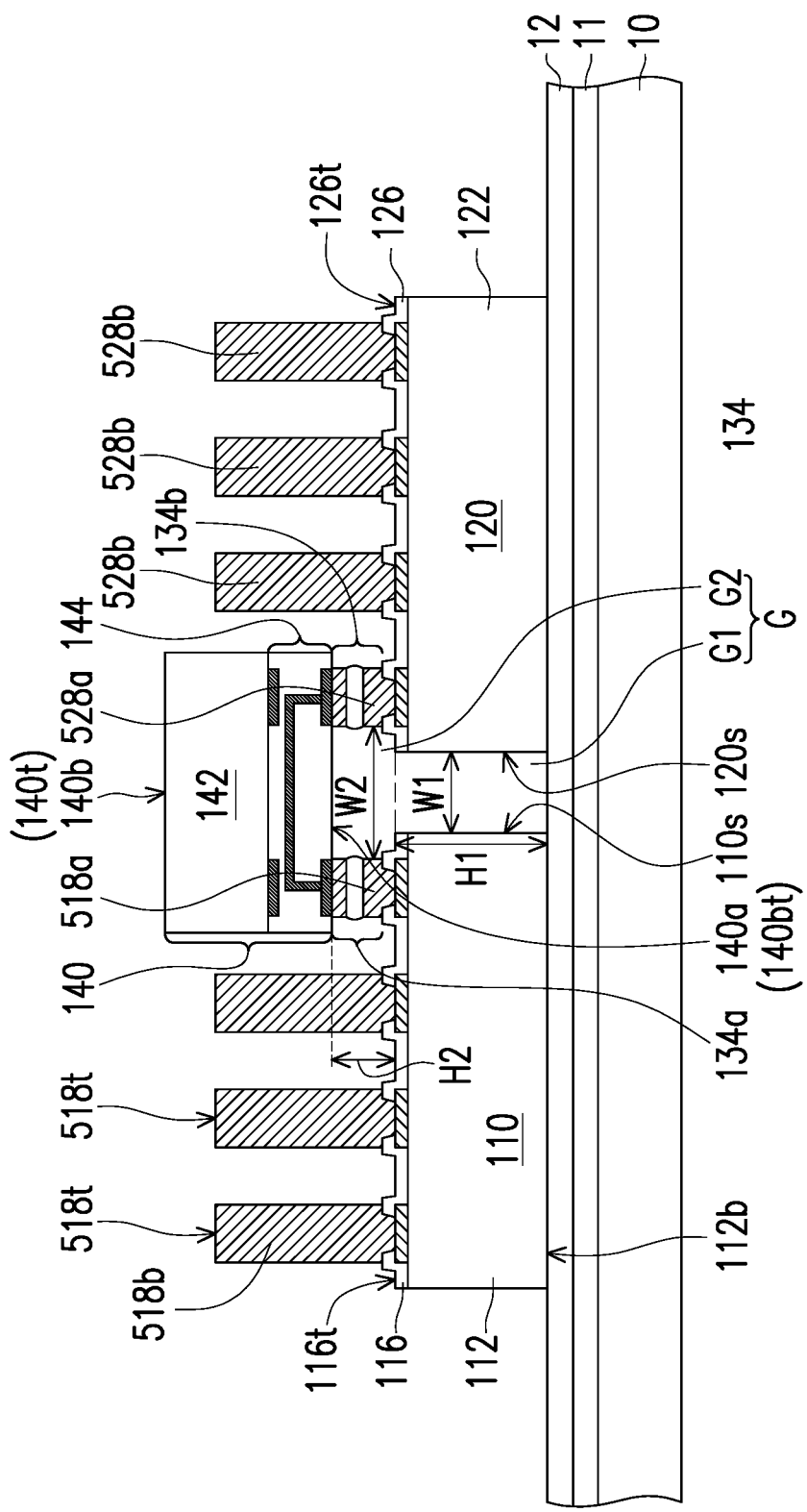

Referring to FIG. 5A and FIG. 5B, the bridge structure 140 is bonded to the first die 110 and the second die 120 in a flip-chip bonding and within the accommodation space 131. That is, the bridge structure 140 is upside down, so that a front side 140a of the bridge structure 140 faces toward the carrier 10. In the case, a back side 140b of the bridge structure 140 is referred to as a top surface 140t of the bridge structure 140, while the front side 140a of the bridge structure 140 is referred to as a bottom surface 140bt of the bridge structure 140.

In FIG. 5B, one of the connectors 148 is bonded to the first conductive via 518a formed on the first die 110 to form a bonding structure 134a, and another one of the connectors 148 is bonded to the first conductive via 528a formed on the second die 120 to form another bonding structure 134b. That is, the bridge structure 140 traverses or is across a gap G formed between the first die 110 and the second die 120. As shown in FIG. 5B, the gap G is surrounded or built-up by the bridge structure 140, the first die 110 and the second die 120.

In detail, the gap G may include a first gap G1 and a second gap G2 on the first gap G1. The first gap G1 is surrounded or defined by a sidewall 110s of the first die 110 and a sidewall 120s of the second die 120 adjacent to each other, and a top surface 116t or 126t of the passivation layer 116 or 126. The second gap G2 is surrounded or defined by a bottom surface 140bt of the bridge structure 140 and the bonding structure 134a, 134b. The second gap G2 is in spatial communication with the first gap G1.

In some embodiments, a width W1 of the first gap G1 is a lateral distance between the first die 110 and the second die 120, namely, the lateral distance is between the sidewall 110s of the first die 110 and the sidewall 120s of the second die 120. A height H1 of the first gap G1 is a longitudinal distance between a bottom surface 112b of the semiconductor substrate 112 and the top surface 116t or 126t of the passivation layer 116 or 126. In some embodiments, the width W1 of the first gap G1 may be 10 µm to 1000 µm, the height H1 of the first gap G1 may be 10 µm to 775 µm, and an aspect ratio (H1/W1) of the first gap G1 may be 0.01 to 100.

In some embodiments, a width W2 of the second gap G2 is a lateral distance between the bonding structure 134a and 134b. A height H2 of the second gap G2 is a longitudinal distance between the bottom surface 140bt of the bridge structure 140 and the top surface 116t or 126t of the passivation layer 116 or 126. In some embodiments, the width W2 of the second gap G2 may be 20 µm to 1100 µm and the height H2 of the second gap G2 may be 10 µm to 50 µm.

Figure 5C:
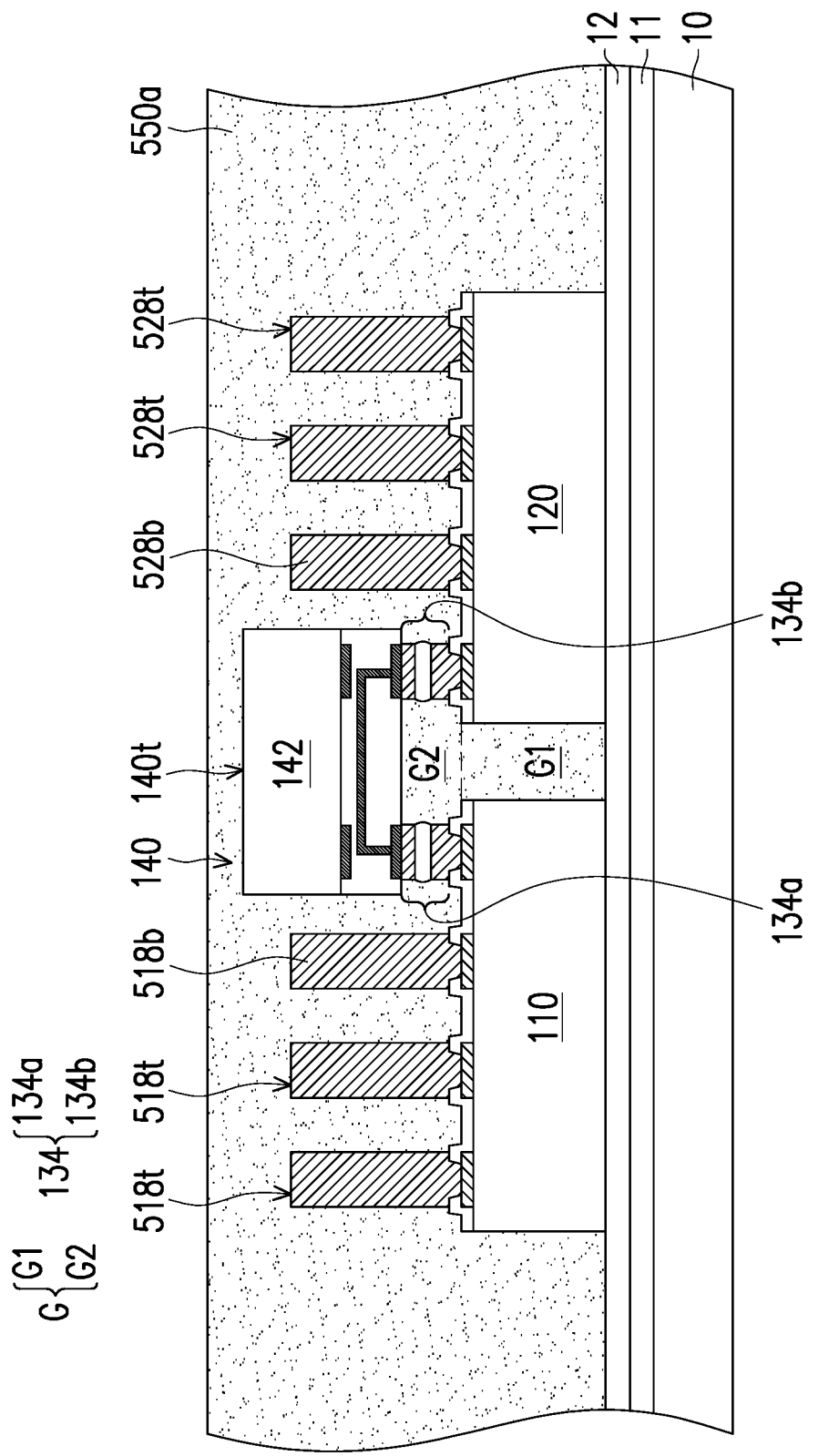

Referring to FIG. 5C, an encapsulation material 550a is formed over the carrier 10 to fill in the gap G between the first die 110, the second die 120, and the bridge structure 140, and encapsulate the first die 110, the second die 120, the bridge structure 140. In addition, the bonding structures 134 and the conductive vias 518 and 528 are fully covered and not revealed by the encapsulation material 150a. Further, the encapsulation material 150a is formed to cover the top surfaces 518t and 528t of the second conductive vias 518b and 528b and the top surface 140t of the bridge structure 140. In some embodiments, the encapsulation material 550a includes a molding compound, a molding underfill, a resin (such as an epoxy resin), or a combination thereof, or the like. In some alternative embodiments, the encapsulation material 550a has a viscosity of 100 Pa·s to 600 Pa·s.

Referring to FIG. 5C, in some embodiments, the encapsulation material 550a is formed by a compression molding process. For example, a mold having a cavity (not shown) is provided. The encapsulation material 550a is provided in the cavity of the mold. The structure illustrated in FIG. 5B is upside down and dipped in the encapsulation material 550a, so that the encapsulation material 550a fills in the gap G and laterally encapsulates the first die 110, the second die 120, and the bridge structure 140. Thereafter, a curing process is performed on the encapsulation material 550a. Unlike the conventional molding process, the encapsulation material 550a is easy to fill in the first gap G1 with high aspect ratio and the second gap G2 with small space in the compression molding process. Therefore, the encapsulation material 550a is able to be distributed uniformly on the whole carrier 10 (including at the edge or the center of the carrier 10) and only few air void included in the encapsulation material 550a filled in the first gap G1 and the second gap G2. That is, the compression molding process is suitable for high throughput due to the simplified process flow and has an advantage of decreasing process cost. Moreover, the compression molding process is also suitable for small package form.

In some alternative embodiments, the encapsulation material 550a is formed by a molding underfill process. In other embodiments, the encapsulation material 550a is formed by an underfill process with a compression molding process. For example, the encapsulation material 550a may be formed by forming a first molding compound that fills in the first gap G1 and laterally encapsulates the first die 110 and the second die 120; grinding the first molding compound; forming the conductive vias 518 and 528, bonding the bridge structure 140 onto the first die 110 and the second die 120 by the bonding structures 134; forming an underfill that fills in the second gap G2 and laterally encapsulates the bonding structures 134; and then forming a second molding compound over the first molding compound and laterally encapsulating the underfill, the bridge structure 140, and the second conductive vias 518b and 528b.

Figure 5D:
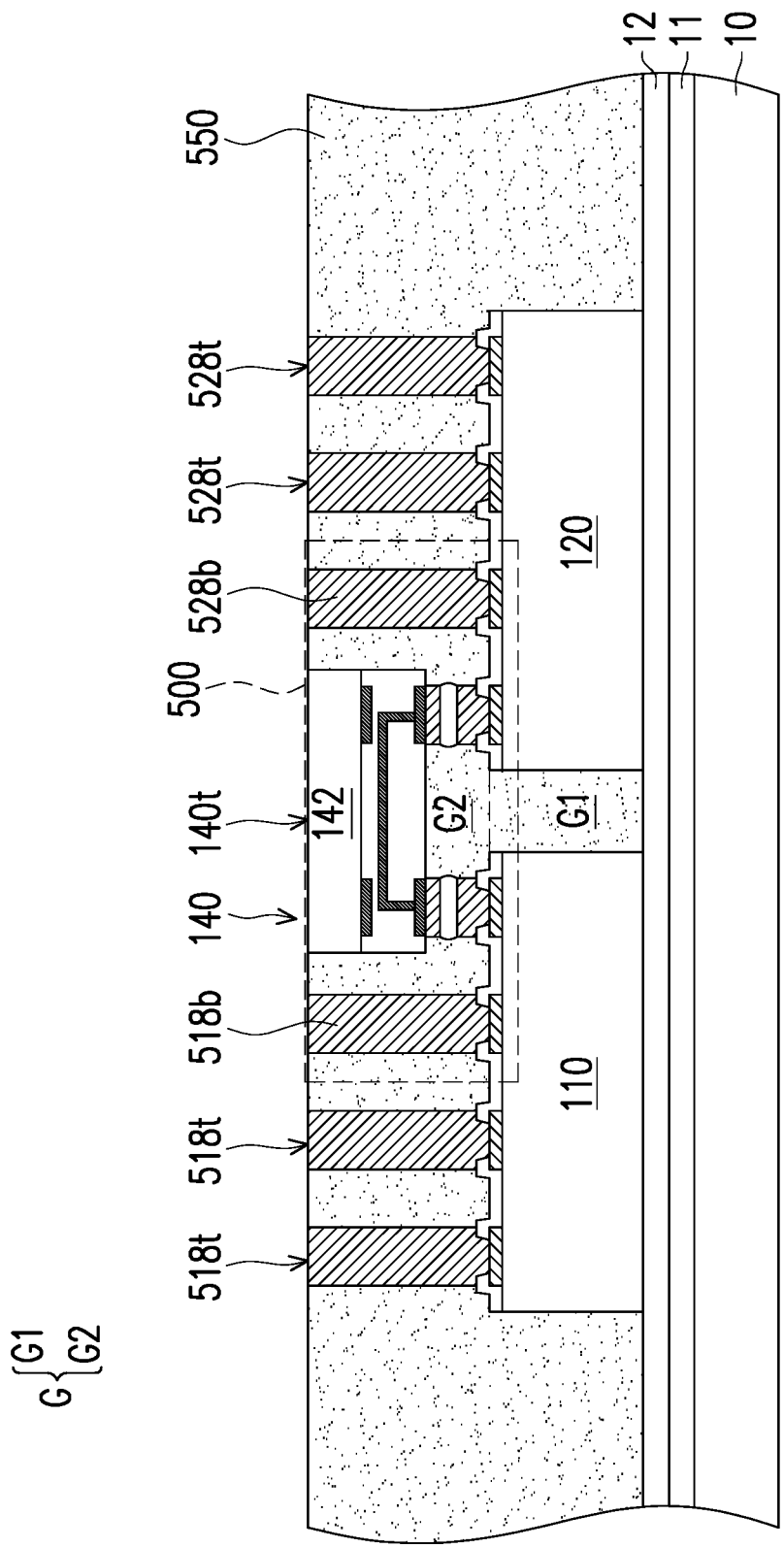

Referring to FIG. 5C and FIG. 5D, in some embodiments, the encapsulation material 550a may be partially removed by a planarizing process until top surfaces 518t and 528t of the second conductive vias 518b and 528b are exposed. In some embodiments, upper portions of the second conductive vias 518b and 528b and/or an upper portion of the bridge structure 140 may also be removed during the planarizing process. Planarization of the encapsulation material 550a may produce an encapsulant 550 located over the carrier 10 to fill in the gap G between the first die 110, the second die 120, and the bridge structure 140, and laterally encapsulate the first die 110, the second die 120, the bridge structure 140. In the case, the second conductive vias 518b, 528b are laterally encapsulated by the encapsulant 550, as shown in FIG. 5C. Therefore, the second conductive vias 518b, 528b may be referred to as through insulating vias (TIVs) 518b, 528b hereafter. In some embodiments, the planarization of the encapsulation material 550a includes performing a mechanical grinding process and/or a chemical mechanical polishing (CMP) process. After the planarization process, the top surface 140t of the bridge structure 140 and the top surfaces 518t and 528t of the TIVs 518b and 528b may be substantially coplanar with a top surface 550t of the encapsulant 550.

Figure 5E:
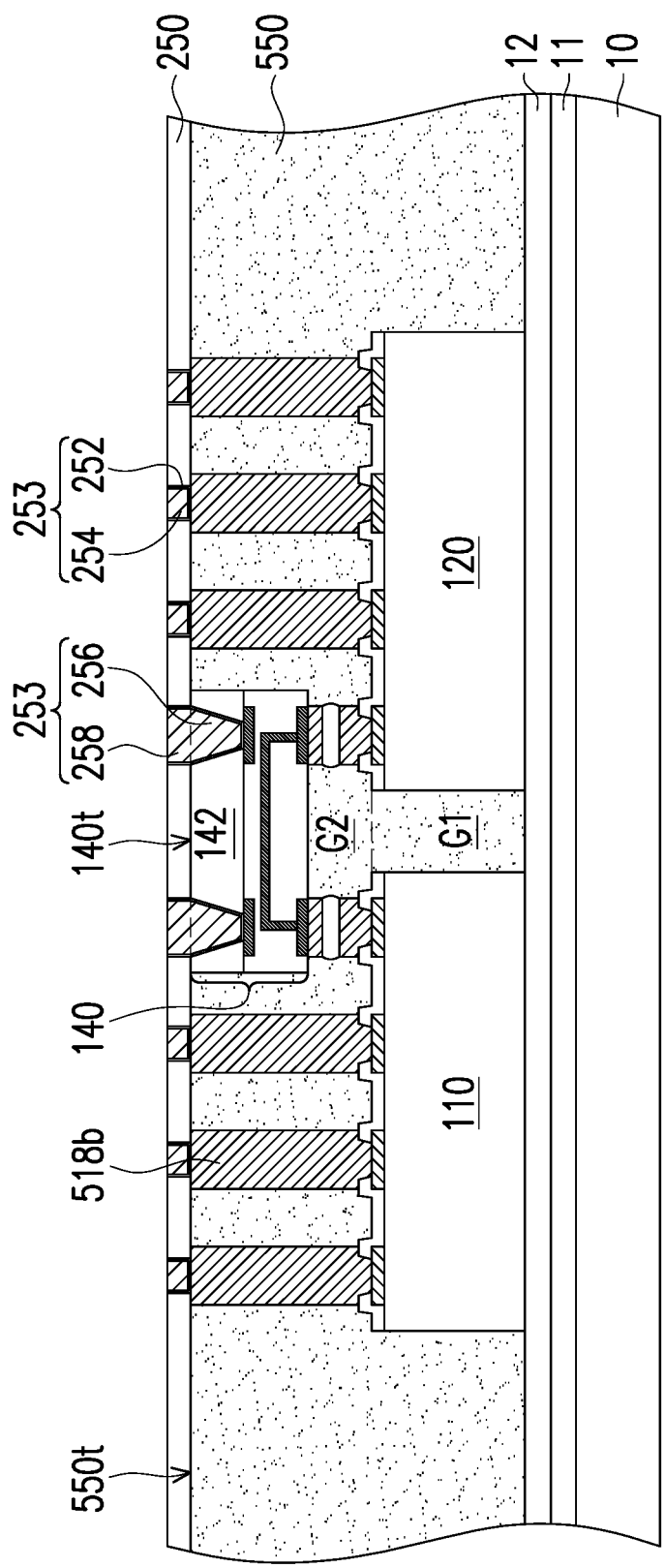

Referring to FIG. 5D and FIG. 5E, an insulating material 250 and a conductive pattern 253 embedded in the insulating material 250 are formed over the top surface 140t of the bridge structure 140 and the top surface 550t of the encapsulant 550. In some embodiments, the insulating material 250 and the conductive pattern 253 are formed by a series of steps as illustrated in FIG. 4A to FIG. 4C, and has been described in detail in the above embodiments. Thus, details thereof are omitted here. In some alternative embodiments, the insulating material 250 and the conductive pattern 253 are formed by a series of steps as illustrated in FIG. 1E to FIG. 1I. That is, the insulating material may laterally encapsulate the TSVs to electrically isolate the TSVs from the substrate of the bridge structure.

Figure 5F:
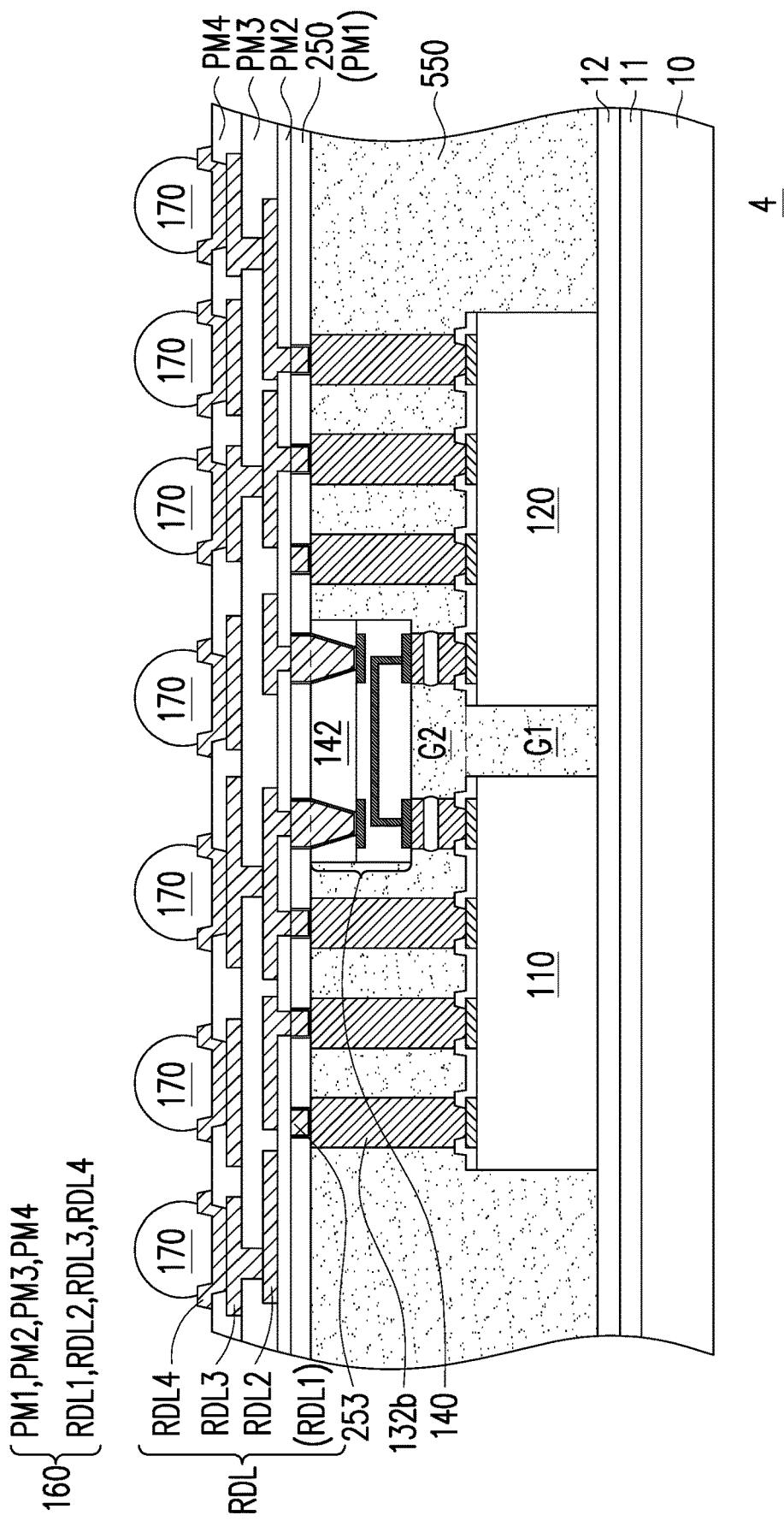

Referring to FIG. 5E and FIG. 5F, after forming the conductive pattern 253, a RDL structure 160 is formed on the encapsulant 550 and the top surface 140t of the bridge structure 140. Thereafter, a plurality of conductive terminals 170 are formed over and electrically connected to the redistribution layer RDL4 of the RDL structure 160. The arrangement, material and forming method of the RDL structure 160 and the conductive terminals 170 have been described in detail in the above embodiments. Thus, details thereof are omitted here.

Figure 5G:
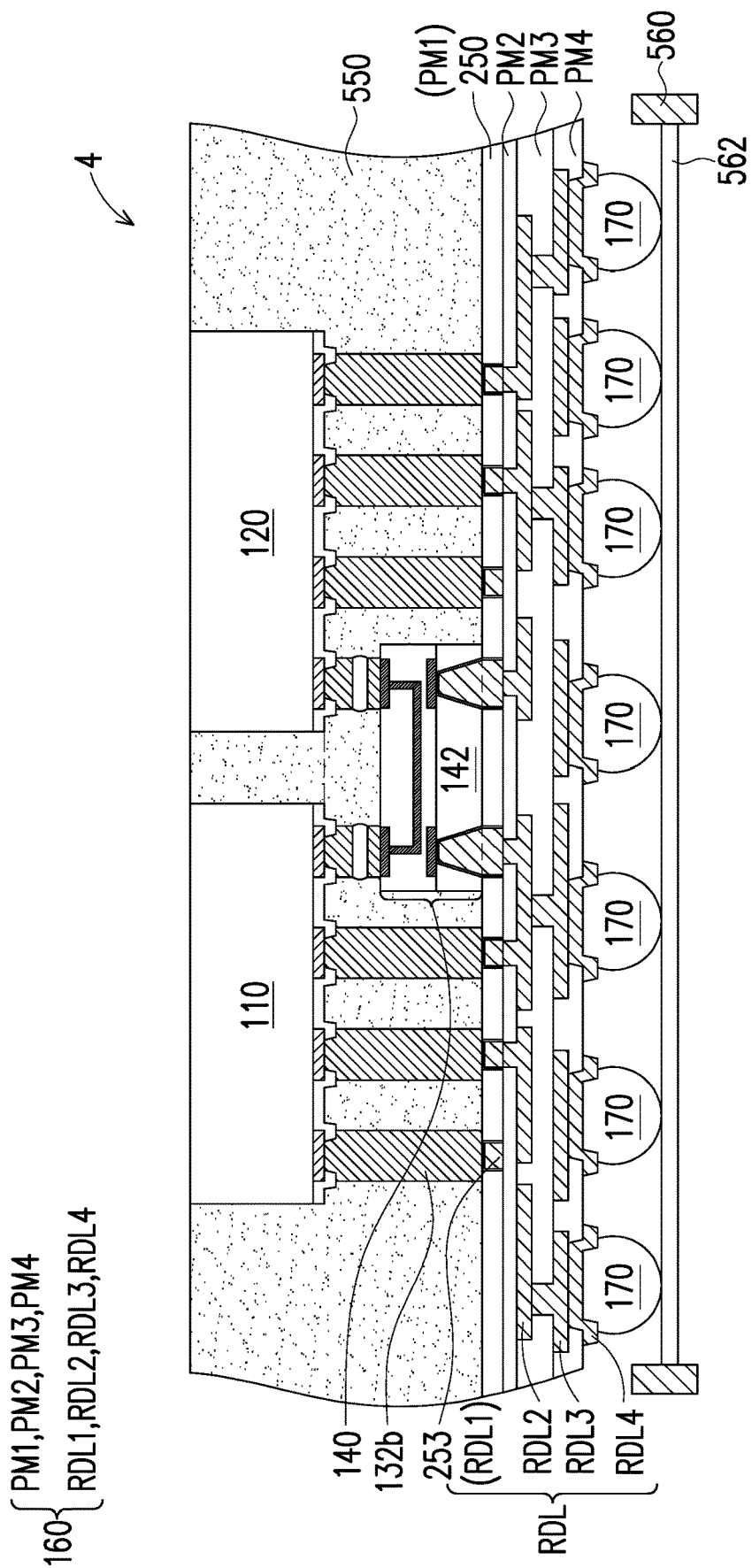

Referring to FIG. 5F and FIG. 5G, after the conductive terminals 170 are formed on the RDL structure 160, a singulation process is performed to dice the structure illustrated in FIG. 5F to form a plurality of package structures 4. In some embodiments, the singulation process involves performing a wafer dicing process with a rotating blade or a laser beam. In other words, the dicing or singulation process is a laser cutting process, a mechanical cutting process, or any other suitable process.

After performing the singulation process, the adhesive layer 12, the de-bonding layer 11, and the carrier 10 are detached from the package structure 4 and then removed. In some embodiments, the de-bonding layer 11 (e.g., the LTHC release layer) is irradiated with a UV laser so that the carrier 10 and the de-bonding layer 11 are easily peeled off from the package structure 4. Nevertheless, the de-bonding process is not limited thereto, and other suitable de-bonding methods may be used in some alternative embodiments.

In FIG. 5G, after the package structure 4 is released from the adhesive layer 12, the de-bonding layer 11, and the carrier 10, the package structure 4 may be mounted and bonded to a tape 562 held tightly by a frame 560.

FIG. 7 is an enlarged view of a portion 500 of the package structure of FIG. 5D.

Referring to FIG. 5D and FIG. 7, the encapsulant 550 may be integrally formed which means the encapsulant 550 filling in the first gap G1, extending upside to fill in the second gap G2, and continuing to laterally encapsulate the bonding structure 134 and the TIVs 518b and 528b. In some embodiments, the encapsulant 550 includes a first portion P1, a second portion P2, and a third portion P3. Herein, the first portion P1 is defined as a region filling in the first gap G1 between the first die 110 and the second die 120 and laterally encapsulating the first die 110 and the second die 120. The second portion P2 is defined as a region filling in the second gap G2, laterally encapsulating the bonding structure 134a between the first die 110 and the bridge structure 140, and laterally encapsulating the bonding structure 134b between the second die 120 and the bridge structure 140. The third portion P3 is defined as a region laterally encapsulating the bridge structure 140, the second portion P2, and the TIVs 518b and 528b. In some embodiments, the first portion P1, the second portion P2, and the third portion P3 have the same material, such as a molding compound, a molding underfill, a resin (such as an epoxy resin), or the like. Herein, the same material means the first portion P1, the second portion P2, and the third portion P3 have the material with substantially the same viscosity, the same average diameter of the filler particles 554, or the same content of the filler particles 554. In some alternative embodiments, the average diameter of the filler particles 554 filling in the gap G is less than the average diameter of the filler particles 554 distributed in other regions out of the gap G.

As shown in FIG. 7, the encapsulant 550 may include a base material 552 and a plurality of filler particles 554 in the base material 552. In some embodiments, the base material 552 may be a polymer, a resin, an epoxy, or the like; and the filler particles 554 may be dielectric particles of $SiO_2$, $Al_2O_3$, silica, or the like, and may have spherical shapes. In some alternative embodiments, the filler particles 554 may be solid or hollow. Also, the filler particles 554 may have a plurality of different diameters. In some embodiments, the filler particles 554 has a diameter of 1 μm to 75 μm. In some other embodiments, the filler particles 554 has an average diameter of 5 μm to 25 μm. The diameter of the filler particles 554 should be small enough to fill in the small gap G. In some other embodiments, a content of the filler particles 554 is about 50 wt % to about 90 wt % based on the total weight of the encapsulant 550.

It should be noted that, in some embodiments, since a portion of the encapsulant 550 facing the first die 110, the second die 120, and the bridge structure 140 is not planarized through CMP or mechanical grinding, the spherical particles 556 in contact with the illustrated the sidewall 110s of the first die 110, the sidewall 120s of the second die 120, the bottom surface 140bt of the bridge structure 140, and the sidewall 140s of the bridge structure 140 have spherical surfaces. As a comparison, another portion of the encapsulant 550 (e.g., the third portion P3) in contact with the polymer layer PM1 has been planarized in the step shown in FIG. 5E. Accordingly, the filler particles 554 in contact with the polymer layer PM1 are partially cut during the planarization, and hence will have substantially planar top surfaces (rather than rounded top surfaces) in contact with the polymer layer PM1. Inner spherical particles 556 not subjected to the planarization, on the other hand, remain to have the original shapes with non-planar (such as spherical) surfaces. Throughout the description, the filler particles 554 that have been polished in the planarization are referred to as partial particles 558. That is, in some embodiments, the first portion P1 and the second portion P2 are full of the spherical particles 556 and are free from the partial particles 558. In some embodiments, a surface 558s that the partial particles 558 are in contact with the RDL structure 160 (as shown in FIG. 5F) and the top surfaces 518t, 528t of the TIVs 518b, 528b are substantially coplanar.

As shown in FIG. 7, since the first portion P1, the second portion P2 and the third portion P3 are formed in the same step (e.g., the compression molding process), a first interface IS1 is not included between the first portion P1 and the second portion P2, and a second interface IS2 is not included between the second portion P2 and the third portion P3. That is, the first portion P1 and the second portion P2 are free from an interface, and the second portion P2 and the third portion P3 are free from another interface. Herein, the first interface IS1 and the second interface IS2 is viewed as virtual interfaces (illustrated as dash lines in FIG. 7) that do not actually exist in the encapsulant 550. In FIG. 7, the first portion P1 and the second portion P2 share at least one of the spherical particles 556 (i.e., a common spherical particle), while the second portion P2 and the third portion P3 share least another one of the spherical particles 556 (i.e., another common spherical particle). In some other embodiments, the spherical particles 556, but no partial particles 558, are included at the first interface IS1 and at the second interface IS2.

Figure 8:
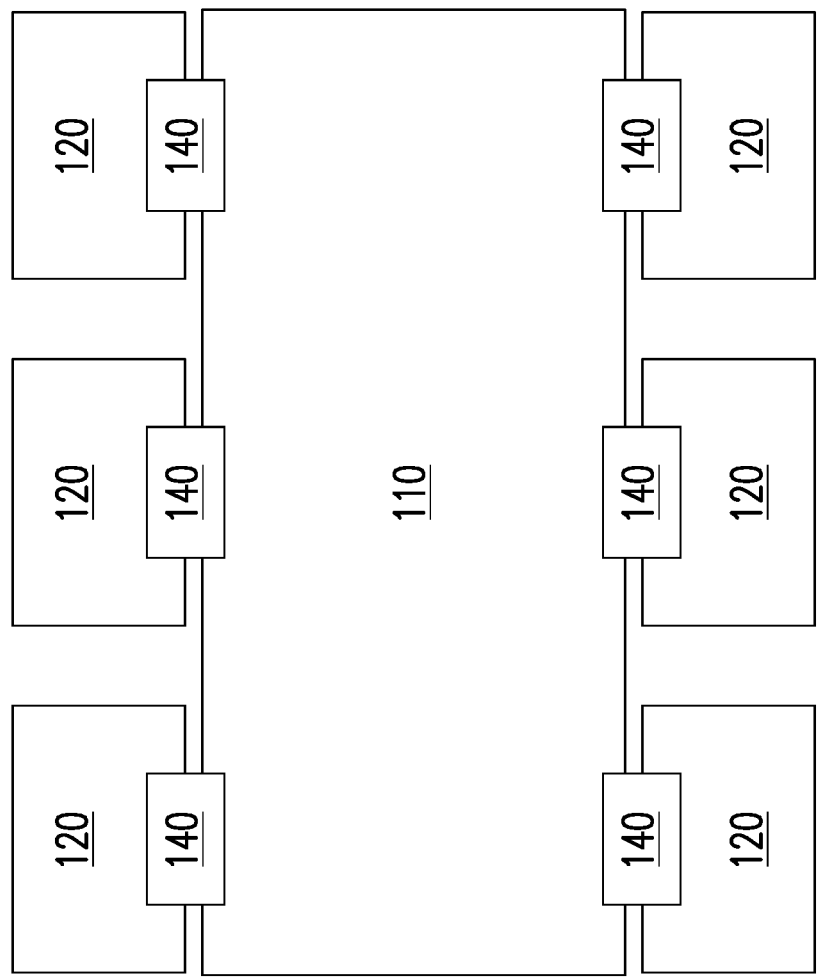
FIG. 8 is a schematic top view illustrating the package structure according to the fourth embodiment of the disclosure.

FIG. 8 is a schematic top view illustrating the package structure according to the fourth embodiment of the disclosure.

Referring to FIG. 8, the package structure 4 includes the first die 110 and the second dies 120 disposed side by side. In the present embodiment, the first die 110 is a system-on-chip (SoC) and the second die 120 is a memory package (e.g., HBM package). In detail, an area of the first die 110 is greater than an area of the second die 120 and the number of the second dies 120 is greater than the number of the first die 110. The second dies 120 are disposed at both sides of the first die 110. The bridge structures 140 are respectively disposed over the first die 110 and the second dies 120 and electrically connecting the first die 110 and the second dies 120. In alternative embodiments, the second die 120 may be another memory package, such as DRAM package, SRAM package, HMC package, or the like, or a combination thereof.

In view of the foregoing, in the embodiment, the first die 110, the second die 120, and the bridge structure 140 can be encapsulated by a single molding process. In the case, the manufacturing steps are simplified, thereby shortening the cycle time and saving the process cost. Further, since the molding steps are reduced, it is possible to have a larger flip chip joint shift window.

In accordance with some embodiments of the disclosure, a method of manufacturing a package includes following steps: providing a first die and a second die disposed side by side; mounting a bridge structure to the first die and the second die in a flip-chip bonding; forming an encapsulant to encapsulate the first die, the second die, and the bridge structure; performing a planarization process to thin the bridge structure, remove a portion of the encapsulant, and expose a backside of the bridge structure; forming a plurality of openings in a substrate of the bridge structure; and forming a plurality of through vias in the plurality of openings and forming a plurality of redistribution layer (RDL) layers over the plurality of through vias.

In accordance with alternative embodiments of the disclosure, a method of manufacturing a package includes following steps: forming a first die and a second die on a carrier; forming a plurality of first conductive vias and a plurality of second conductive vias on the first and second dies, wherein the plurality of first conductive vias has a height less than a height of the plurality of second conductive to form an accommodation space; mounting a bridge structure in the accommodation space, so that the bridge structure is electrically connected to the first and second dies; forming an encapsulant to laterally encapsulate the first die, the second die, and the bridge structure; forming a plurality of openings in a semiconductor substrate of the bridge structure; and forming a redistribution layer (RDL) structure on a backside of the bridge structure and the encapsulant, wherein the RDL structure at least comprises an insulating structure, the insulating structure extends from the backside of the bridge structure into the semiconductor substrate of the bridge structure to laterally encapsulate a plurality of through vias in the plurality of openings, so that the plurality of through vias are electrically isolated from the semiconductor substrate of the bridge structure.

In accordance with some embodiments of the disclosure, a method of manufacturing a package includes following steps: forming a first die and a second die on a carrier; forming a plurality of first conductive vias and a plurality of second conductive vias on the first and second dies, wherein the plurality of first conductive vias has a height less than a height of the plurality of second conductive to form an accommodation space; mounting a bridge structure in the accommodation space, so that the bridge structure is electrically connected to the first and second dies; forming an encapsulant to encapsulate the first die, the second die, the bridge structure, a plurality of first conductive vias, and the plurality of second conductive vias in a same step; performing a planarization process to thin the bridge structure, remove a portion of the encapsulant, and expose a backside of the bridge structure; forming an insulating material on the backside of the bridge structure; removing a portion of the insulating material and a portion of the substrate of the bridge structure, so as to form the plurality of openings in the substrate of the bridge structure; and forming a conductive pattern in the plurality of openings, wherein the conductive pattern has a seed layer conformally covering a sidewall and a bottom surface of the plurality of openings and across a contact interface between the backside of the bridge structure and a bottom surface of the insulating material, so as to extend between the insulating structure and the substrate of the bridge structure.

The foregoing outlines features of several embodiments so that those skilled in the art may better understand the aspects of the disclosure. Those skilled in the art should appreciate that they may readily use the disclosure as a basis for designing or modifying other processes and structures for carrying out the same purposes and/or achieving the same advantages of the embodiments introduced herein. Those skilled in the art should also realize that such equivalent constructions do not depart from the spirit and scope of the disclosure, and that they may make various changes, substitutions, and alterations herein without departing from the spirit and scope of the disclosure.

What is claimed is:

1. A method of manufacturing a package, comprising:
providing a first die and a second die disposed side by side;
mounting a bridge structure to the first die and the second die in a flip-chip bonding;
forming an encapsulant to encapsulate the first die, the second die, and the bridge structure;
performing a planarization process to thin the bridge structure, remove a portion of the encapsulant, and expose a backside of the bridge structure;
forming a plurality of openings in a substrate of the bridge structure; and
forming a plurality of through vias in the plurality of openings respectively and forming a plurality of redistribution layers (RDLs) over the plurality of through vias.

2. The method of claim 1, wherein the forming the plurality of through vias in the plurality of openings and forming the plurality of RDLs over the plurality of through vias comprises:

forming an insulating material in the plurality of openings, wherein the insulating material extends from the plurality of openings to cover the backside of the bridge structure;
patterning the insulating material to expose a bottom surface of the plurality of openings; and
filling in the plurality of openings with a conductive material that extends to cover the backside of the bridge structure, wherein the insulating material laterally encapsulates the plurality of through vias to electrically isolate the plurality of through vias from the substrate of the bridge structure.

3. The method of claim 2, wherein the patterning the insulating material comprises performing exposure and development processes, so that a lower sidewall of one of the plurality of through vias has an arc profile in a cross section.

4. The method of claim 2, wherein the insulating material is in direct contact with a sidewall of the plurality of through vias.

5. The method of claim 1, wherein the forming the plurality of openings in the substrate of the bridge structure comprises:
forming an insulating material over the backside of the bridge structure; and
removing a portion of the insulating material and a portion of the substrate of the bridge structure, so as to form the plurality of openings in the substrate of the bridge structure, wherein an upper width of one of the plurality of openings is greater than a lower width thereof.

6. The method of claim 5, wherein the forming the plurality of through vias in the plurality of openings and forming the plurality of RDLs over the plurality of through vias comprises:
forming a seed layer to conformally cover a sidewall and a bottom surface of the plurality of openings, so that the seed layer extends between the substrate of the bridge structure and the insulating material; and
forming a conductive material over the seed layer.

7. The method of claim 1, further comprising forming a protective layer over the first die, wherein the protective layer extends from the first die to cover the second die.

8. The method of claim 1, wherein the forming the encapsulant comprises a compression molding process, a molding underfill process, or a combination thereof.

9. A method of manufacturing a package, comprising:
forming a first die and a second die over a carrier;
forming a plurality of first conductive vias and a plurality of second conductive vias over the first and second dies, wherein the plurality of first conductive vias has a height less than a height of the plurality of second conductive vias to form an accommodation space;
mounting a bridge structure in the accommodation space, so that the bridge structure is electrically connected to the first and second dies;
forming an encapsulant to laterally encapsulate the first die, the second die, and the bridge structure;
forming a plurality of openings in a semiconductor substrate of the bridge structure; and
forming a redistribution layer (RDL) structure over a backside of the bridge structure and the encapsulant, wherein the RDL structure at least comprises an insulating structure, the insulating structure extends from the backside of the bridge structure into the semiconductor substrate of the bridge structure to laterally encapsulate a plurality of through vias in the respective plurality of openings, so that the plurality of through vias are electrically isolated from the semiconductor substrate of the bridge structure.

10. The method of claim 9, wherein the forming the RDL structure comprises:
forming an insulating material in the plurality of openings, wherein the insulating material extends from the plurality of openings to cover the backside of the bridge structure;
patterning the insulating material to expose a bottom surface of the plurality of openings; and
filling in the plurality of openings with a conductive material, wherein the conductive material extends to cover the backside of the bridge structure, so that the plurality of through vias are formed in the plurality of openings respectively and a plurality of redistribution layers (RDLs) are formed over the plurality of through vias.

11. The method of claim 10, wherein after the forming the insulating material and before the filling in the plurality of openings with the conductive material, the method further comprises:
forming a seed layer to conformally cover a sidewall and a bottom surface of the plurality of openings, wherein the seed layer is in contact with a plurality of contacts over an interconnecting structure of the bridge structure.

12. The method of claim 10, wherein the patterning the insulating material comprises performing exposure and development processes, so that a lower sidewall of one of the plurality of through vias has an arc profile in a cross section.

13. The method of claim 9, wherein the forming the plurality of openings in a semiconductor substrate of the bridge structure comprises:
forming a mask pattern over the encapsulant; and
performing an etching process by using the mask pattern as an etching mask to remove a portion of the semiconductor substrate of the bridge structure, so as to form the plurality of openings in the semiconductor substrate of the bridge structure, thereby exposing a plurality of contacts over an interconnecting structure of the bridge structure,
wherein the etching process comprises a deep reactive-ion etching (DRIE) process.

14. The method of claim 13, wherein one of the plurality of openings comprises a sidewall with scalloped recesses.

15. A method of manufacturing a package, comprising:
forming a first die and a second die over a carrier;
forming a plurality of first conductive vias and a plurality of second conductive vias over the first and second dies, wherein the plurality of first conductive vias has a height less than a height of the plurality of second conductive vias to form an accommodation space;
mounting a bridge structure in the accommodation space, so that the bridge structure is electrically connected to the first and second dies;
forming an encapsulant to encapsulate the first die, the second die, the bridge structure, a plurality of first conductive vias, and the plurality of second conductive vias in a same step;
performing a planarization process to thin the bridge structure, remove a portion of the encapsulant, and expose a backside of the bridge structure;
forming an insulating material over the backside of the bridge structure;

removing a portion of the insulating material and a portion of the substrate of the bridge structure, so as to form a plurality of openings in the substrate of the bridge structure; and forming a conductive pattern in the plurality of openings, wherein the conductive pattern has a seed layer conformally covering a sidewall and a bottom surface of each of the plurality of openings and across a contact interface between the backside of the bridge structure and a bottom surface of the insulating material, so as to extend between the insulating structure and the substrate of the bridge structure.

16. The method of claim 15, wherein the bridge structure is mounted onto the first die and the second die in a flip-chip bonding, and connected to the plurality of first conductive vias.

17. The method of claim 15, wherein after the performing the planarization process, the backside of the bridge structure is level with a top surface of the encapsulant.

18. The method of claim 15, further comprising removing the carrier to expose a backside of the first die and a backside of the second die.

19. The method of claim 15, wherein the substrate of the bridge structure is a dielectric substrate, and the seed layer is in direct contact with the sidewall and the bottom the surface of each of the plurality of openings.

20. The method of claim 15, wherein one of the plurality of openings has an upper width greater than a lower width thereof.

* * * * *